United States Patent [19]

Cohen

[11] Patent Number: 4,833,678
[45] Date of Patent: May 23, 1989

[54] HARD-WIRED SERIAL GALOIS FIELD DECODER

[75] Inventor: Earl T. Cohen, Berkeley, Calif.

[73] Assignee: Cyclotomics, Inc., Berkeley, Calif.

[21] Appl. No.: 76,579

[22] Filed: Jul. 22, 1987

[51] Int. Cl.[4] .............................. G06F 11/10
[52] U.S. Cl. ........................... 371/37; 371/38
[58] Field of Search ............ 371/37, 38, 39, 40, 371/41, 42

[56] References Cited

U.S. PATENT DOCUMENTS 4,633,470  12/1986  Welch et al. ................... 371/37

OTHER PUBLICATIONS

IEEE Trans. on Computers, Shao, H. et al., "A VLSI Design of a Pipeline Reed–Solomon Decoder", vol. C-34, No. 5, May 1985, pp. 393-402.

Primary Examiner—Jerry Smith
Assistant Examiner—Stephen M. Baker
Attorney, Agent, or Firm—Robert M. Wallace

[57] ABSTRACT

An error detection and correction processor computes in real time successive approximations to a Galois field error locator polynomial and a Galois field error evaluator polynomial from the remainder or syndrome polynomial of a received block of data by executing successive iterations of a recursive algorithm. The processor stores each coefficient of the polynomials in an individually addressable memory location. During each iteration, the processor operates on successive ones of the coefficients of each polynomial in successive memory access cycles to compute a new version of the coefficient which replaces the old one in memory.

23 Claims, 17 Drawing Sheets

FIG. 11

$$r_{(K)0}z^0 + r_{(K)1}z^1 + r_{(K)2}z^2 + r_{(K)3}z^3 + \ldots \ldots r_{(K)i-1}z^{i-1} + r_{(K)i}z^i + \ldots$$
$$\times z$$
$$r_{(K)0}z^1 + r_{(K)1}z^2 + r_{(K)2}z^3 + \ldots \ldots \ldots \ldots \ldots r_{(K)i-1}z^i + \ldots$$

FIG. 12a $$(\sigma_{(K)0}z^0 + \sigma_{(K)1}z^1 + \sigma_{(K)2}z^2 + \ldots + \sigma_{(K)K}z^K + \ldots) \times (s_0 z^0 + s_1 z^1 + s_2 z^2 + \ldots + s_K z^K + \ldots) =$$
$$z^0(\ldots\ldots) + z^1(\ldots\ldots) + z^2(\ldots\ldots) + \ldots\ldots + z^{K+2}(\sigma_{(K+1)0}s_{K+2} + \ldots \sigma_{(K+1)i}s_{K+2-i} \ldots + \sigma_{(K)K}s_2)$$
$$\longrightarrow \Delta_{(K+1)}$$

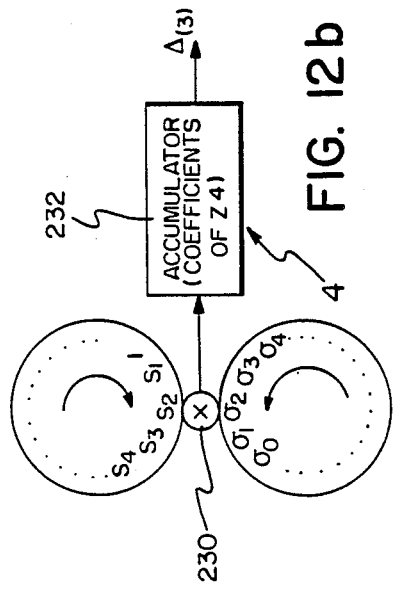

FIG. 12b $$N_0 Z^0 + N_1 Z^1 + N_2 Z^2 + \cdots N_i Z^i + \cdots = N_0 + Z(N_1 + Z(N_2 + Z(N_3 + Z(\cdots + Z(N_i + Z(\cdots))))))$$

HARD-WIRED SERIAL GALOIS FIELD DECODER

BACKGROUND OF THE INVENTION

Introduction to Error Correction Coding

A problem encountered in data storage and communication systems is how to deal with errors which are externally introduced, either during the process of data storage and retrieval (in a data storage system) or during the process of data transmission and reception (in a data transmission system). Referring to FIG. 1, such data systems may be characterized as a transmitter communicating with a receiver over a channel, as in communication over a telephone line between two computers. The channel—or telephone line—is inherently noisy and introduces errors into the data as received by the receiver. In another example relevant to FIG. 1, the storage and retrieval of data from mass memory systems (such as computer tape drives and computer disc drives) involves a data channel comprising the interface between the storage medium (e.g. magnetic tape) and the detector (e.g. the magnetic head). Noise in the magnetic tape-magnetic head interface introduces errors into data stored and retrieved in such mass memory systems, particularly when such storage and retrieval is performed at very high data rates. In the following discussion, FIG. 1 may be thought of as depicting a transmitter modem and a receiver modem providing communication between two computers over a telephone line.

Referring to FIG. 2, the computer bytes transmitted over the channel from the transmitter modem to the receiver modem of FIG. 1 are, typically, not transmitted in a continuum but, instead are divided into blocks of bytes, each byte being transmitted, received and processed separately. In the simplified example of FIG. 2, the transmitted block consists of five three-bit bytes, while in practical application the bytes are usually 8 bits wide and the number of bytes per block may be in the tens or hundreds, or even more. However, sticking with the simplified example of FIG. 2, all five bytes of the transmitted block do not have to be dedicated to the user data, and in fact one or more of the five bytes could be reserved for other purposes, the user data being transmitted in the remaining bytes. In the example of FIG. 2, the first three bytes of the five-byte block are filled with the user data in the order received, these three bytes being the "message bytes". The remaining two bytes of the block are redundant "check bytes" and are computed from the contents of the message bytes before transmission. It is the check bytes that provide the key to the detection and removal of any errors introduced into the code block during transit through the channel. Such error correction is to be performed by the receiver of FIG. 1.

A Fictional Error Correction Scheme

Using only high school algebra, we may construct an imaginary error detection scheme for the example of FIG. 2. First a codeword polynomial in powers of x is associated with the five-byte code block, the first byte of the block (byte number 0) being the coefficient of $x^0$, the second byte of the block (byte number 1) being the coefficient of $x^1$, ... et cetera ... and the last byte of the block (byte number 4) being the coefficient of $x^4$. Thus, the three message bytes (bytes numbers 4, 3 and 2) are the coefficients of $x^4$, $x^3$ and $x^2$ of the polynomial.

The transmitter of FIG. 1 computes the remaining two bytes (the check bytes—byte numbers 1 and 0) from the message bytes by demanding that the codeword polynomial corresponding to the entire five-byte block be an algebraic multiple of some previously selected polynomial, called the code generator polynomial. In the example of FIG. 2, the code generator polynomial is $x^2+x+1$. This selection is made by the system designer and is known to both the transmitter and the receiver.

In the example of FIG. 2, the three byte message to be transmitted is 1, 2, 3 corresponding to a message polynomial of $1x^4+2x^3+3x^2$. The remaining (check) bytes are computed by algebraically dividing the message polynomial by the code generator polynomial to obtain a remainder polynomial. In the example of FIG. 2, one obtains a remainder of $-(2x+1)$. Subtracting this remainder from the message polynomial results in a codeword polynomial $x^4+2x^3+3x^2+2x+1$, corresponding to a codeword 1 2 3 2 1. FIG. 2 shows the representation of this codeword as a sequence of three bit bytes, the first three bytes being message bytes and the last two bytes being check bytes. The reader is encouraged to confirm that the codeword polynomial constructed by this process is indeed divisible by the code generator polynomial with a remainder of zero.

As soon as the receiver of FIG. 1 receives the five-byte codeword of FIG. 2, it may immediately determine, from the code generator polynomial, whether or not an error was introduced into the codeword during transmission through the channel. It simply performs the polynomial division process illustrated in FIG. 2 on the received codeword. Obviously, if no errors were introduced in the channel, this division results in a zero remainder. On the other hand, if the division results in a non-zero remainder, the receiver immediately deduces that an error is present in the received data.

Transition to Galois Field Algebra

Theoretically, if the receiver detects a non-zero remainder after performing the polynomial division on the received data, the remainder polynomial, together with the code generator polynomial, constitutes sufficient information to compute the error bit-pattern in the received data, as long as the number of erroneous bytes does not exceed half the number of the check bytes (for certain types of codes). (No attempt will be made in this specification to explain why this is so. However, a thorough explanation is given in *Algebraic Coding Theory* by Elwyn R. Berlekamp, Aegean Park Press, 1984.) Thus, in the example of FIG. 2, the two check bytes theoretically enable the receiver to detect and correct one erroneous byte, as long as no more than one byte in the received codeword contains errors. To do this, the remainder computed by the receiver must be processed using a special algebra, called Galois field algebra. Such Galois field algebra treats each byte as a vector-like quantity called an "m-tuple" whose dimension m is equal to the number of bits in the byte. There is no "carry" from one bit position to the next in Galois field addition operations, unlike the usual arithmetic operations characteristic of high school algebra.

As a consequence, all polynomial operations in this specification will be defined in terms of a "carry-less" arithmetic, in which the carry bit which may result from the addition of two or more bits is simply discarded rather than being added to the next highest bit position. This principle is applied to not only addition but also subtraction, multiplication and division, such as the polynomial division illustrated in FIG. 2. This type of algebra restricts arithmetic operations to a finite set of numbers determined solely by the number of bits in each byte, this finite set being called a Galois field, as distinguished from the infinite field of numbers characteristic of high school algebra.

In the Galois field, the independent variable shall be called z, instead of x.

Simple Galois Field Example

The encoding process employed in FIG. 2 did not use Galois field algebra. In attempting to apply Galois field algebra to the example of FIG. 2, one first observes that there are three bits in each byte of the codeword in FIG. 2. Table I lists all possible three-bit bytes:

TABLE I

| Three-bit Bytes | | |
|---|---|---|
| Byte | Decimal Equivalent | Galois Field Label |
| 000 | 0 | 0 |
| 001 | 1 | $\alpha^0 = \alpha^7$ |
| 010 | 2 | $\alpha = \alpha^1$ |
| 100 | 4 | $\alpha^2$ |
| 011 | 3 | $\alpha^3$ |
| 110 | 6 | $\alpha^4$ |
| 111 | 7 | $\alpha^5$ |
| 101 | 5 | $\alpha^6$ |

The bytes listed in the left-hand column of Table I are all of the elements of a particular Galois field. There are eight such elements in this particular Galois field. The number of elements is equal to p, the number of states of each bit (p=2 for binary bits) raised to the power m, where m is the number of bits per byte (m=3 in FIG. 2 and in Table I). Thus, for the Galois field of Table I, $p^m = 2^3 = 8$. Any Galois field may be specified as $GF(p^m)$. So, the Galois field of Table I is GF(8).

Using the fact that Galois field arithmetic rules disregard (drop) all carry bits, the following addition table may be constructed for the GF(8) elements of Table I in a straight-forward manner:

TABLE II

| Addition Table for GF(8) | | | | | | | | |
|---|---|---|---|---|---|---|---|---|
| + | 0 | 1 | 2 | 3 | 4 | 5 | 6 | 7 |
| 0 | 0 | 1 | 2 | 3 | 4 | 5 | 6 | 7 |
| 1 | 1 | 0 | 3 | 2 | 5 | 4 | 7 | 6 |
| 2 | 2 | 3 | 0 | 1 | 6 | 7 | 4 | 5 |
| 3 | 3 | 2 | 1 | 0 | 7 | 6 | 5 | 4 |
| 4 | 4 | 5 | 6 | 7 | 0 | 1 | 2 | 3 |
| 5 | 5 | 4 | 7 | 6 | 1 | 0 | 3 | 2 |
| 6 | 6 | 7 | 4 | 5 | 2 | 3 | 0 | 1 |
| 7 | 7 | 6 | 5 | 4 | 3 | 2 | 1 | 0 |

Each element $\alpha^i$ listed in Table I is some unique power of $\alpha^1$ (i.e., 010), in accordance with the superscripts of $\alpha$ in the right-hand column of Table I. Furthermore, $\alpha^7 = \alpha^0$, so that the set of elements $\alpha^i$ in Table I is said to be "cyclic". From these properties, one may directly construct a multiplication table, using $\alpha^2 = \alpha^1 \times \alpha^1$, $\alpha^3 = \alpha^1 \times \alpha^2$, $\alpha^4 = \alpha^2 \times \alpha^2$, $\alpha^5 = \alpha^3 \times \alpha^2$, ... etc.

TABLE III

| Multiplication Table for GF(8) | | | | | | | | |
|---|---|---|---|---|---|---|---|---|
| x | 0 | 1 | 2 | 3 | 4 | 5 | 6 | 7 |
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 3 | 1 | 7 | 5 |
| 3 | 0 | 3 | 6 | 5 | 7 | 4 | 1 | 2 |
| 4 | 0 | 4 | 3 | 7 | 6 | 2 | 5 | 1 |
| 5 | 0 | 5 | 1 | 4 | 2 | 7 | 3 | 6 |

TABLE III-continued

| Multiplication Table for GF(8) | | | | | | | | |
|---|---|---|---|---|---|---|---|---|
| x | 0 | 1 | 2 | 3 | 4 | 5 | 6 | 7 |
| 6 | 0 | 6 | 7 | 1 | 5 | 3 | 2 | 4 |
| 7 | 0 | 7 | 5 | 2 | 1 | 6 | 4 | 3 |

As illustrated in FIG. 3, one uses the ordered set of the Galois field elements $\alpha^i$ as location characters individually designating the various byte locations in the transmitted codeword. FIG. 3 shows that the codeword polynomial C(z) has power series coefficients $C_i$, each coefficient $C_i$ corresponding to one of the bytes in the transmitted codeword. The codeword coefficients $C_i$ reflect the message contents and must be zero or various ones of the elements $\alpha^i$ of the Galois field. The number of message bytes (or message "characters") in the codeword is k and the number of check bytes (or check "characters") in the codeword is r. In FIG. 3, the r check locations in the transmitted codeword are uniquely designated by r location characters comprising r Galois field elements ($\alpha^0$ through $\alpha^{r-1}$). The k message byte locations in the codeword are uniquely designated by k location characters comprising the rest of the Galois field elements (i.e., $\alpha^{n-k}, \ldots, \alpha^{n-1}$) as illustrated in FIG. 3. The minimum number of bits, m, comprising each location character or byte may be computed from the requirement that there are $k+r=n$ byte locations in the transmitted codeword which must be uniquely specified by a bit pattern within an m-bit byte. (m must be at least $\log_2 n$ in order to specify n distinct byte locations.) In the simple example of FIG. 2, n=5, k=3 and r=2.

It should be recalled, again, that the encoding process of FIG. 2 did not use Galois field algebra and that the code generator polynomial of FIG. 2 was chosen arbitrarily. In order to perform such encoding with Galois field algebra, one must choose a code generator polynomial G(z) whose roots are various ones of the elements $\alpha^i$ of the Galois field (e.g., the set of $\alpha^i$'s listed in Table I). The code generator polynomial G(z) must have r such roots. Typically, one chooses for the r roots of G(z) an ordered subset from the set of all $\alpha^i$'s, namely $\alpha^L, \alpha^{L+1}, \ldots, \alpha^{L+r-1}$. [If, for example, L is chosen so that the subset $\alpha^L, \ldots, \alpha^{L+r-1}$ symmetrically straddles the middle of the ordered set of all $\alpha^i$'s (as illustrated in FIG. 3), then the m-bit code generator polynomial coefficients $G_0, G_1, \ldots, G_r$ of G(z) symmetrically repeat (i.e., $G_0 = G_{r-1}$, $G_1 = G_{r-2}$, ... etc.), which can greatly simplify the encoding hardware.] In FIG. 2, r=2, so, in this case, one must choose two of the elements $\alpha^i$ from Table I for the two roots of the code generator polynomial G(z). For example, one might choose $\alpha^1$ and $\alpha^2$ as the two roots (in which case L=1, which is not a "symmetrical" choice). In this case:

$$G(z) = (z - \alpha^1)(z - \alpha^2).$$

Referring to Table I, $\alpha^1 = 2$ and $\alpha^2 = 4$:

$$G(z) = (z-2)(z-4).$$

One may carry out the multiplication $(z-2)(z-4)$ using the multiplication tables (Table III):

$$G(z) = z^2 - 6z + 3.$$

The encoding process using this particular polynomial is similar to the process described previously in connection with FIG. 2, in that the message polynomial $C_M(z)$ (e.g., $1z^4+2z^3+3z^2$) is divided by the code generator polynomial $G(z)$ (i.e., $z^2-6z+3$), but using the GF(8) multiplication rules of Table III. The resulting remainder ($C_p(z)$) is then appended to the message polynomial $C_M(z)$ (in the manner illustrated in FIG. 2) to form a complete codeword polynomial C(z). The details of this process applied to the current example need not be given here.

Encoder Processor

In such an error correction system, each location character, each polynomial coefficient and any other character is an m-bit byte.

A typical encoder processor 1 is illustrated at the top of FIG. 4, and operates in accordance with the principles illustrated in FIG. 2 and FIG. 3. Specifically, a message polynomial $C_M(z)$, defined by k message bytes, is received by the encoder processor 1. The encoder processor 1 divides the message polynomial $C_M(z)$ by a Galois field code generator polynomial $G(z)$ to obtain a quotient and a remainder $C_p(z)$ in the Galois field. The remainder $C_p(z)$ is added to the message polynomial $C_M(z)$ to yield the codeword polynomial $C(z)$.

The Decoding Problem

The problem to be solved by the decoder may be formulated as follows: The channel superimposes an error pattern $E(Z)=E_0+E_1Z+E_2Z^2+$ ... etc., onto the transmitted codeword C(Z) so that the decoder receives a corrupted codeword $C'(Z)=C(Z)+E(Z)$. Because of the manner in which C(Z) was formed using the code generator polynomial G(Z), the roots of G(Z) are also roots of the codeword polynomial C(Z) so that $C(\alpha^i)=0$ for each root $\alpha^i$ of G(Z). Therefore, the decoder may compute the error pattern E(Z) from the received codeword C'(Z) by evaluating the equation $$C'(Z)=C(Z)+E(Z)$$

at each root $\alpha^i$ of G(Z) as follows:

$$C'(\alpha^i)=C(\alpha^i)+E(\alpha^i).$$

Because $C(\alpha^i)=0$, this equation simplifies to $C'(\alpha^i)=E(\alpha^i)$, or equivalently, $C'(\alpha^i)=E_0+E_1\alpha^i+E_2\alpha^{i2}+$ ... etc., for each root of $\alpha^i$ of G(Z).

If there are r roots of G(Z), then there are r such equations. E(Z) may be found by solving the r equations for the coefficients $E_0$, $E_1$, $E_2$, etc. of E(Z) (as long as no more than r/2 of these coefficients are non-zero). The transmitted (error-free) codeword C(Z) is then computed from the received codeword C'(Z) by subtracting E(Z) from C'(Z).

If r is relatively large (in order to correct large numbers of errors) then the foregoing algorithm is too ponderous and slow for use in high speed decoding hardware. A high speed decoder which uses a more efficient algorithm is now described.

Decoder Processor

The sophisticated portion of the system is contained in a decoder processor 2 depicted in FIG. 4. Before describing the decoder processor, its theory of operation shall first be described here. The decoder processor 2 tests the received codeword polynomial C'(z) (which may differ from the transmitted codeword C(z)) to determine whether any errors exist. In accordance with FIG. 2, the decoder processor FIG. 4 divides the received codeword polynomial C'(z) by the generator polynomial G(z). If the resulting remainder polynomial R(z) is zero, then no errors are detected and no correction is necessary. On the other hand, if a non-zero remainder polynomial R(z) is obtained, then R(z) and the code generator polynomial G(z) comprise enough information to locate and correct all erroneous bytes in the received data, as long as the number of erroneous bytes does not exceed half the number of check bytes (for certain types of codes). Therefore, appropriate algebraic processing of the remainder polynomial R(z) should yield those byte location characters $\alpha^e$ corresponding to byte locations containing errors. Furthermore, for each such byte location character $\alpha^e$, algebraic processing should also yield an error correction byte $Y(\alpha^e)$ by which the received byte at location $\alpha^e$ must be changed to yield the correct byte.

Definition of the Desired Algebraic Processing Results

In order to achieve the foregoing goals, we wish to process the remainder polynomial R(z) in such a manner as to obtain two polynomials: an error locator polynomial $\sigma(z)$ whose only roots are reciprocals of those byte location characters $\alpha^e$ corresponding to the received bytes containing errors; and, an error evaluator polynomial $\omega(z)$ which, when evaluated at each of the error locations (by setting $z=\alpha^e$) may be used to generate the error correction byte $Y(\alpha^e)$ in a manner to be described.

Description Of The Decoder Processor

In order to generate the two polynomials $\sigma(z)$, $\omega(z)$, the decoder processor 2 includes a syndrome generator 3 and a syndrome processor 4. The syndrome generator 3 evaluates the remainder polynomial R(z) at each of the r roots of the code generator polynomial (e.g., $\alpha^1$ through $\alpha^r$, if L=1) to generate r different bytes or characters $S_1$ through $S_r$ called syndromes. The syndromes $S_1$ through $S_r$, may then be associated with a polynomial S(z) equal to $1+S_1z_1+$ ... $+S_rz^r$. This syndrome polynomial S(z) is then processed in a highly sophisticated manner (to be described below) by the syndrome processor 4 to yield the two polynomials $\sigma(z)$ and $\omega(z)$.

The remaining task is relatively simple and is performed in the decoder processor 2 by an error corrector 5. The error corrector 5 first locates the erroneous message bytes by finding the roots of $\sigma(z)$. The roots of $\sigma(z)$ are actually the reciprocals $1/\alpha^e$ of the location characters $\alpha^e$ of the erroneous bytes in the codeword. The error corrector 5 then generates each error correction byte $Y(\alpha^e)$ by a process which includes evaluating $\omega(z)$ at $z=1/\alpha^e$ (or $\alpha^{-e}$).

Syndrome Processor

The syndrome processor 4 constructs $\sigma(z)$ and $\omega(z)$ simultaneously by a series of successive iterations of a recursive algorithm. Operation of the syndrome processor 4 and of the error corrector 5 is best illustrated in FIG. 5. It was earlier stated in this specification that no attempt will be made herein to explain why the remainder polynomial R(z) contains sufficient information to locate and correct all errors up to one half the number of check bytes. Likewise, no attempt will be made herein to explain why the recursive algorithm performed by the syndrome processor 4 yields the correct form of the error locator polynomial $\sigma(z)$ and the error evaluator polynomial $\omega(z)$. Nevertheless, FIG. 5 sets forth the algorithm performed by the syndrome processor 4. (This algorithm was the first practical one known and was discovered by Elwyn R. Berlekamp. It is described in his book, *Algebraic Coding Theory*, Aegean Park Press. 1984.)

Berlekamp Algorithm

First, the polynomials $\sigma(z)$ and $\omega(z)$ are initialized to unity. Two other "dummy" polynomials $\tau(z)$ and $\gamma(z)$ (used in the algorithm) are initialized to 1 and 0 respectively. The syndrome generator 3 furnishes the entire syndrome polynomial S(z) (which remains unchanged throughout the iteration performed by the syndrome processor 4). As stated before, all arithmetic operations herein are performed in the Galois field. Initially, all quantities $\sigma$, $\omega$, $\tau$, $\gamma$, and $\Delta$ have the subscript (0) corresponding to iteration number zero. During the next iteration, they each have the subscript (1), corresponding to iteration number one. Iteration 0 finds the first order approximation to each of these quantities, whereupon their subscripts change from (0) to (1). Each iteration, starting with iteration number 0, proceeds as follows. The first task is to compute an m-bit character $\Delta_{(k)}$ (the subscript (k) denoting the number of iterations completed thus far), where $\Delta_{(k)}$ is the m-bit coefficient of $z^{k+1}$ in the product $S(z) \times \sigma_{(k)}(z)$. Then, the next approximations to the error locator and error evaluator polynmials, namely $\sigma_{(k+1)}(z)$ and $\omega_{(k+1)}(z)$ are computed from the current approximations to all four polynomials, namely $\sigma_{(k)}(z)$, $\omega_{(k)}(z)$, $\tau_{(k)}(z)$ and $\alpha_{(k)}(z)$ and from $\Delta_{(k)}$, in accordance with the recursion formulas for $\sigma_{(k+1)}(z)$ and $\omega_{(k+1)}(z)$ illustrated in FIG. 5. Similarly, the next approximations to the two "dummy" polynomials, namely $\tau_{(k+1)}(z)$ and $\alpha_{(k+1)}(z)$ are computed from one of two sets of recursion formulas illustrated in FIG. 5 for $\tau_{(k+1)}(z)$ and $\alpha_{(k+1)}(z)$, the choice between recursion formulas being determined according to the value of $\Delta_{(k)}$. This concludes the $k^{th}$ iteration, and the next $(k+1^{st})$ iteration begins. The algorithm stops when the number of iterations reaches r, the number of check bytes. The last approximations to $\sigma(z)$, $\omega(z)$ are then used by the error corrector 5 to make the necessary corrections to the received data.

Error Corrector 5

In order to determine the location vectors $\alpha^e$ of the error-containing bytes in the codeword, a Chien search processor 5a in the error corrector 5 evaluates the polynomial $\sigma(z)$ at $z = 1/\alpha^i$. In doing so, it tries all $\alpha^{i}$'s corresponding to the various codeword byte locations starting at $\alpha^{n-1}$ (the first received byte location) and ending at $\alpha^0$. Each $1/\alpha^i$ at which $\sigma(z) = 0$ is the reciprocal of an error location character $\alpha^e$. The error corrector 5 uses the error location character $\alpha^e$ to deduce when the error-containing byte enters a summing node 5b.

A $Y_e$ processor 5c generates a character $\omega(\alpha^{-e})$ and a character $\sigma'(\alpha^{-e})$ by evaluating the error evaluator polynomial $\omega(z)$ and the derivative of the error evaluator polynomial, $d/dz\ (\sigma(z))$, respectively, at $z = \alpha^{-e}$. The $Y_e$ processor then generates $Y_e$ by dividing $\omega(\alpha^{-e})$ by $\sigma'(\alpha^{-e})$ and multiplying the result by $(\alpha^e)^{L+1}$. $Y_e$ is the error correcting bit-pattern or character for the byte at location $\alpha^e$ in the codeword. $Y_e$ is then fed to the summing node 5b under control of an enable timer 5d at the precise moment the corresponding (erroneous) codeword byte arrives at the summing node 5b, so that the corrected value $Y_e$ is superimposed thereon to generate a corrected byte. Ideally, the timing of all of this is controlled by a data clock synchronous with the rate of the incoming codeword data. Thus, these corrections are all performed in real time, in the ideal case.

The Problem To Be Solved By The Invention

The error correction capability of the decoder processor 2 of FIG. 4 is limited by practical constraints. This is true whether the decoder processor 2 is implemented as a programmed general purpose computer or as a dedicated "hard-wired" processor. Specifically, as a programmed computer, the decoder processor 2 must execute thousands of software cycles in order to decode one incoming codeword of about 30 bytes (k message bytes plus r check bytes). The number of execution cycles required for each block is proportional to $nr + r^2/2$. At incoming data rates in the range of 10 megabits per second, a software-implemented decoding processor cannot operate in real time and eventually falls behind the incoming data. Of course, the problem may be alleviated by simply reducing the number of check byte locations, but this unfortunately reduces the error correction capacity of the system, and therefore is really no solution at all.

Brute Force Approach

If the syndrome processor 4 were implemented instead as a dedicated "hard-wired" processor, it would perform virtually all the arithmetic operations of each iteration of the algorithm FIG. 5 in parallel so that the iteration time would be determined only by gate delays through the hardware, which are much smaller than software execution cycle delays. Thus, such a dedicated "hard-wired" decoder processor would have much less of a problem in keeping up with very fast incoming data rates. It would process r syndromes in r clock cycles.

However, its implementation would require so many hardware logic gates that it would be impractical. This is because the number of logic gates increases with the square of the number of correctable bytes, or as $r^2/2$. For example, if the maximum number of correctable byte-errors exceeds four, the number of logic gates is in the tens of thousands, making the cost of such a dedicated decoder processor beyond the realm of commercial feasibility.

FIG. 6 illustrates in simplified schematic form such a dedicated "hard-wired" syndrome processor, corresponding to the syndrome processor 4 of the FIGS. 4 and 5. Each arithmetic operation unit, such as the various Galois field multipliers and subtracters denoted in FIG. 6, operates under the rules of the Galois field discussed previously herein. It is well known that a binary Galois field subtraction is identical to a binary Galois field addition, so that each subtracter illustrated in FIG. 6 is really an adder. What makes the "hard-wired" brute force approach of FIG. 6 untenable is that each arithmetic operation must be performed on bytes which are m-bits wide and on polynomials having coefficients comprising r bytes. Thus the output lines emanating from the $\sigma$-register of FIG. 6, for example, transmit r bytes (each byte comprising m-bits) to the subtracter and divider shown in FIG. 6 immediately below the σ-register. This gives rise to an amazing level of complexity. A single multiplier having the ability to multiply the byte Δ by the polynomial τ(z) (illustrated in FIG. 7) comprises r individual Galois field multipliers. In order to implement the rules of Galois field multiplication, the architecture of FIG. 8 must be employed for *each individual* multiplier. FIG. 8 illustrates an implementation of a single one of these Galois field multipliers for eight-bit bytes. In this figure, an X register and a Y register are multiplied together by apportioning their outputs between two programmable-read-only-memories, the memories being employed to generate the correct output bit pattern depending upon the input bit patterns, in accordance with Galois field multiplication rules (e.g. Table III). The outputs of the two programmable-read-only memories are in turn added together by a Galois field adder (an exclusive OR gate) to give the final result, X times Y. Thus, each of the r individual multipliers of FIG. 7 comprise a multiplier unit corresponding to the hardware illustrated in FIG. 8. The same proliferation of hardware applies to all the arithmetic operation units (multipliers, subtracters, dividers) shown in FIG. 6. This proliferation makes the "brute force" implementation of FIG. 6 an unacceptable solution to the problem.

State of the Art

In view of the foregoing, it has seemed to those skilled in the art that one must choose either a slow software implemented error corrector (number of software cycles being proportional to $r^2$) or a bulky hard-wired implemented error corrector like that of FIG. 6 (number of logic gates being proportional to $r^2$ and the number of logic cycles being proportional to r). To make the slow software implementation faster or the bulky hard-wired implementation smaller requires reducing r. This in turn reduces the error correction capacity per codeword (r/n bytes). Without such limitations, a designer could endow his system with the capability of correcting large numbers of errors by generously increasing the number r of check byte locations in the transmitted codeword. The foregoing limitations, however, have prevented the full realization of such ideal error correction systems.

BRIEF SUMMARY OF THE INVENTION

An error detection and correction processor computes in real time successive approximations to a Galois field error locator polynomial and a Galois field error evaluator polynomial from the remainder or syndrome polynomial of a received block of data by executing successive iterations of a recursive algorithm. The processor stores each coefficient of the polynomials in an individually addressable memory location. During each iteration, the processor operates on successive ones of the coefficients of each polynomial in successive memory access cycles to compute a new version of the coefficient which replaces the old one in memory.

BRIEF DESCRIPTION OF THE DRAWINGS

The prior art and the invention are described in this specification with reference to the accompanying drawings, some of which have already been referred to above in connection with the background of the invention, of which:

FIG. 11 illustrates the multiplier shift operation described in connection with FIG. 9;

FIGS. 12a-12b illustrate another multiplier operation described in connection with the operation of the system of FIG. 9;

DETAILED DESCRIPTION OF THE INVENTION

Solution to the Problem

Figure 5:
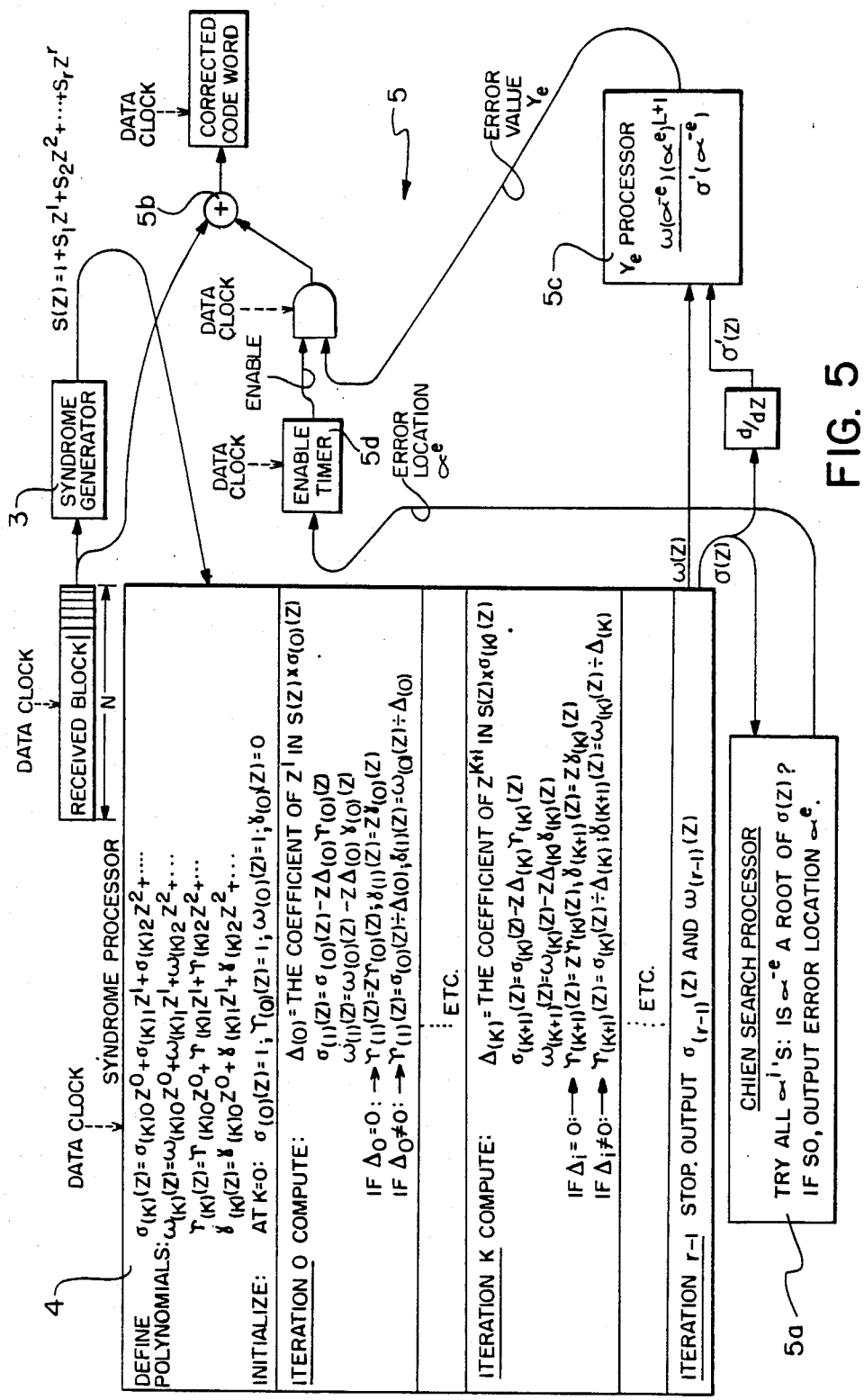
FIG. 5 illustrates the syndrome processor of the system of FIG. 4 incorporating the Berlekamp key equation solver.

The present invention is a realization of the syndrome processor 4 of FIG. 5 which uses no software and in which the number of logic gates does not increase quadratically with the number of check bytes r, but instead increases only linearly. Thus, software execution cycle delays are completely avoided and an unacceptable proliferation of hardware (number of logic gates) is avoided.

Serial Architecture

The invention accomplishes all of this in a syndrome processor architecture in which each arithmetic operation unit operates serially on the coefficients of a Galois field polynomial, coefficient by coefficient, during successive memory access cycles.

Figure 6:
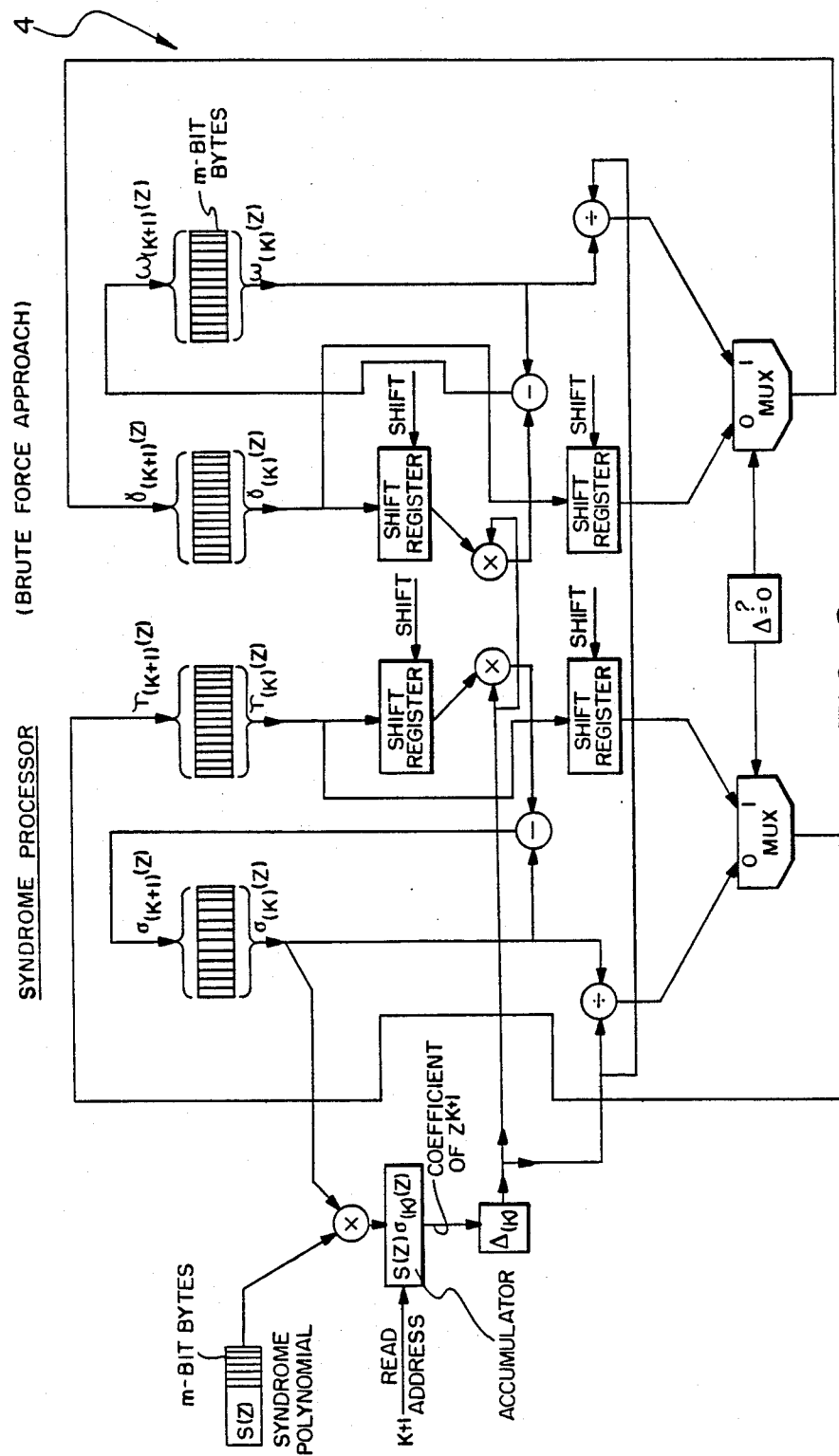
FIG. 6 is a block diagram illustrating a brute force approach to implementation of the syndrome processor of FIG. 5.
Figure 7:
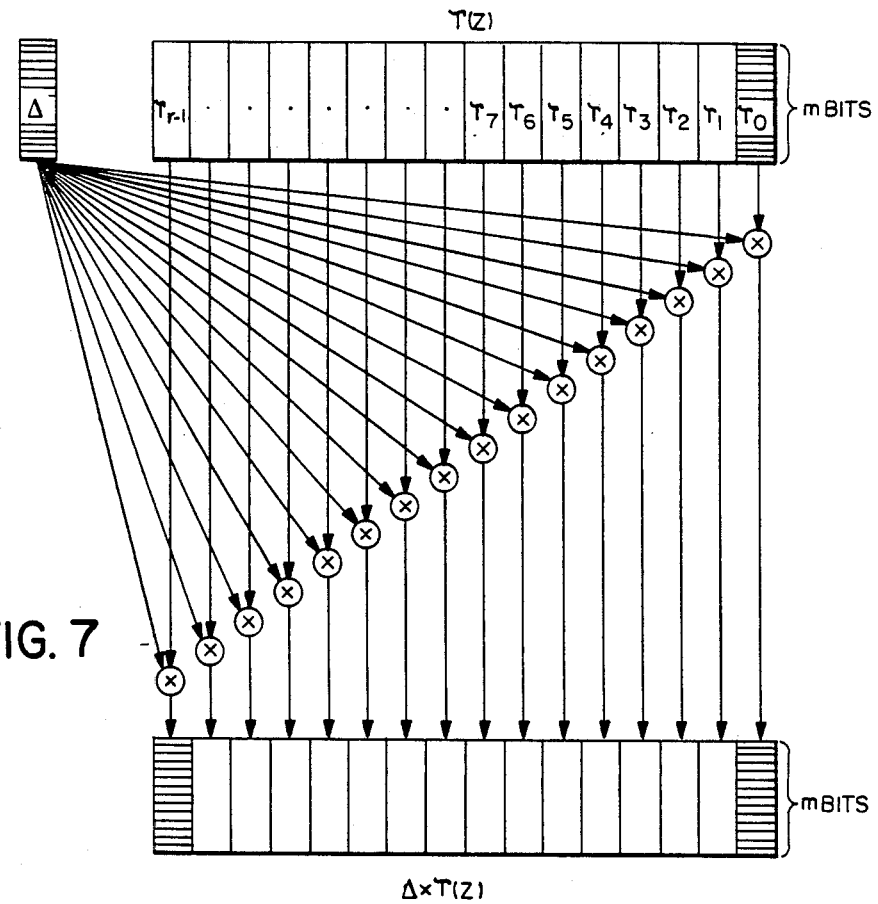
FIG. 7 illustrates the plural multiplication stages in each multiplier of FIG. 6.
Figure 8:
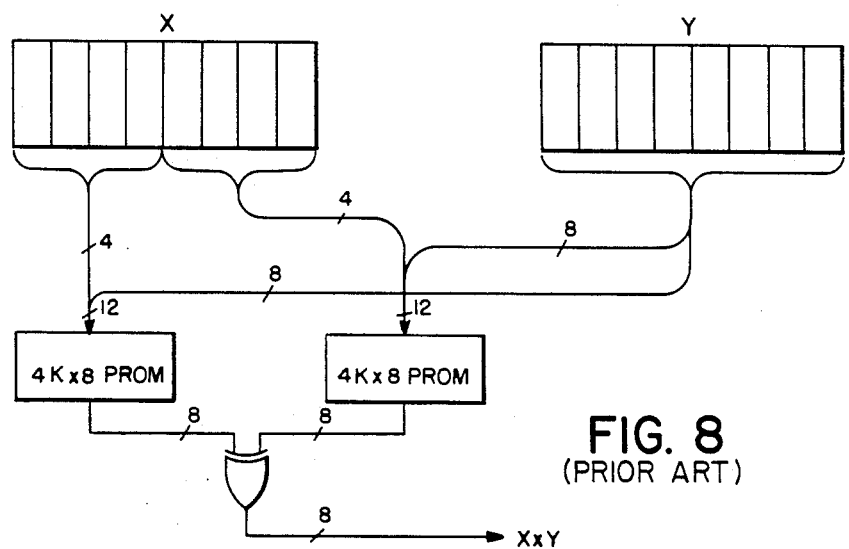
FIG. 8 illustrates how each of the plural multiplication stages in FIG. 7 is implemented using prior art techniques.
Figure 9:
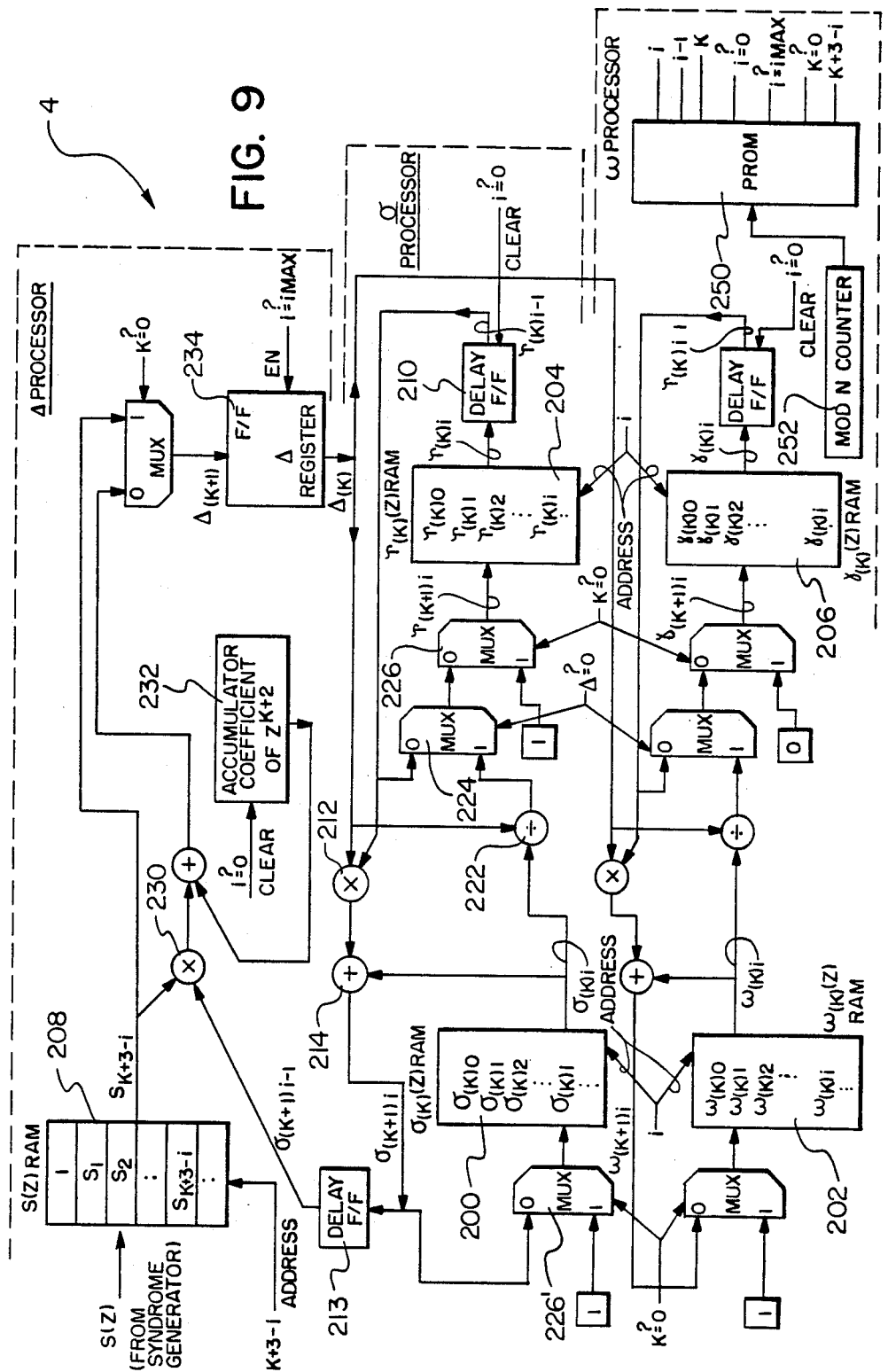
FIG. 9 illustrates a first embodiment of the invention.

Referring to FIG. 9, the dramatic savings in hardware (in comparison with the "brute force" syndrome processor of FIG. 6) is immediately apparent. While in FIG. 6, each arithmetic operation unit (multiplier, adder, divider, etc.) actually represents a large plurality of individual ones of operators (as in FIGS. 7 and 8), in contrast, each arithmetic operation unit shown in FIG. 9 comprises only a single arithmetic operator (adder, multiplier or divider). For example, a multiplier arithmetic operation unit in FIG. 9 requires *only one* multiplier unit of the type illustrated in FIG. 8.

Serial Syndrome Processor

Operation of the syndrome processor 4 of FIG. 9 will be described with reference to the basic algorithm illustrated in FIG. 5. More particularly, execution of the $k^{th}$ iteration (denoted "iteration k" in FIG. 5) of the basic algorithm by the syndrome processor 4 of FIG. 9 is described. During the $k^{th}$ iteration, the current approximations to the four polynomials, $\sigma_{(k)}(z)$, $\omega_{(k)}(z)$, $\tau_{(k)}(z)$, $\gamma_{(k)}(z)$, are stored in four respective random access memories (RAM's) 200, 202, 204, 206 respectively. Each coefficient of each respective polynomial is stored in its own m-bit location in RAM. For example, the $i^{th}$ location in the $\sigma_{(k)}(z)$-RAM 200 contains the m-bits of the $i^{th}$ coefficient of the $k^{th}$ iterative approximation to the polynomial $\sigma(z)$, this coefficient being denoted uniquely as $\sigma_{(k)i}$. The syndrome polynomial S(z) is stored in a RAM 208 in similar fashion, individual coefficients of the polynomial S(z) being stored in respective individual RAM locations. During execution of the algorithm of FIG. 5, the contents of the first four RAM's 200, 202, 204, 206 changes as the approximation to each polynomial is updated with each iteration. The previous approximation is read out of and the next approximation is written into each of the RAM's 200, 202, 204, 206 with each iteration. The key, however, is that only one coefficient of each polynomial is read out of memory and operated upon at any one time in the syndrome processor of FIG. 9.

Discussion of the first step of iteration k of FIG. 5, namely the computation of the m-bit character $\Delta_{(k)}$, shall be postponed for now. The description begins with the next computation, namely that of the $(k+1)^{st}$ approximation, $\sigma_{(k+1)}(z)$, to the error locator polynomial $\sigma(z)$.

Computation of the Error Locator Polynomial

Referring to FIG. 9, an address index i applied to the memory 200 is incremented once during each of a succession of memory access cycles, so that, during each successive memory access cycle, a successive one of the polynomial coefficients currently stored in the $\sigma$-RAM 200, namely the coefficient $\sigma_{(k)i}$, is addressed and read out of the RAM 200. Simultaneously, the same address index i is applied to the $\tau$-RAM 204, so that the coefficient $\tau_{(k)i}$ is read out of the $\tau$-RAM 204.

Referring to the algorithm of FIG. 5, the second step in the algorithm requires (among other things) multiplication of the polynomial $\tau_{(k)}(z)$ by the variable z. The polynomial $\tau_{(k)}(z)$ is (of course) the sum of the products of each coefficient $\tau_{(k)i}$ with $z^i$, for i=0, 1, 2, . . . etc. In the serial architecture of the invention illustrated in FIG. 9, the multiplication of $\tau_{(k+1)}(z)$ by z is readily achieved by simply shifting each coefficient $\tau_{(k)i}$ by one memory location, so that each coefficient $\tau_{(k)i}$ now multiplies $z^{i+1}$ in the polynomial, instead of $z^i$. The principle is illustrated in FIG. 11: multiplication of the polynomial $\tau_{(k)}(z)$ by z simply shifts the individual coefficient $\tau_{(k)i}$ by just one place (to the right, as illustrated in FIG. 11). This same shift is accomplished in the architecture of FIG. 9 by interposing a delay flip-flop 210 between the read output and the write input of the RAM 204. The delay flip-flop 210 stores the present coefficient $\tau_{(k)i}$ (unloaded from the RAM 204 during the current ($i^{th}$) memory access cycle) and transmits the coefficient $\tau_{(k)i-1}$ previously unloaded from the RAM 204 during the last memory access cycle. In order to multiply $\tau_{(k)}(z)$ by $\Delta_{(k)}$ (as required in the second step of the $k^{th}$ iteration of the algorithm of FIG. 5), the coefficient $\tau_{(k)i-1}$ is multiplied in a multiplier 212 by the character $\Delta_{(k)}$. In order to implement the subtraction operation required in the second step of the $k^{th}$ iteration, the product generated by the multiplier 212 is added in an adder 214 to the coefficient $\sigma_{(k)i}$ (which has been read out from the RAM 200 during the current ($i^{th}$) memory access cycle). The sum generated by the adder 214 is the coefficient of $z^i$ in the polynomial $\sigma_{(k+1)}(z)$ and is therefore loaded into the RAM 200 into the $i^{th}$ location made available when the coefficient $\sigma_{(k)i}$ was read out therefrom and transmitted to the adder 214. In this manner, during successive memory access cycles, each of the individual address locations in the RAM 200 are individually read out and then written into, so as to generate the next approximation to the polynomial $\sigma(z)$.

The $\tau$-RAM is replenished in analogous fashion during the $k^{th}$ iteration. Specifically, referring to the last two steps of iteration k of the algorithm of FIG. 5, the next approximation $\tau_{(k+1)}(z)$ is one of the following choices: $z\tau_{(k)}(z)$ or $\sigma_{(k)}(z)/\Delta_{(k)}$, depending upon whether $\Delta_{(k)}$ is zero or not, respectively. As already described, the $i^{th}$ coefficient of the first one of these two choices is already available at the output of the delay flip-flop 210. The other choice is generated by simply transmitting the coefficient $\sigma_{(k)i}$ and the character $\Delta_{(k)}$ to a divider 222. A multiplexer 224 makes the choice between the output of the delay flip-flop 210 and the output of the divider 222, depending upon whether $\Delta_{(k)}$ is equal to zero, for transmission to a second multiplexer 226. The multiplexer 226 transmits the output of the multiplexer 224 to the write input of the RAM 204. (At the beginning of the algorithm of FIG. 5, when k=0, the multiplexers 226, 226' transmit the unity vector to the RAM's 204, 200, respectively, in accordance with the initialization conditions obtaining in the beginning of the algorithm of FIG. 5.)

Progression of the i and k indices

Figure 10:
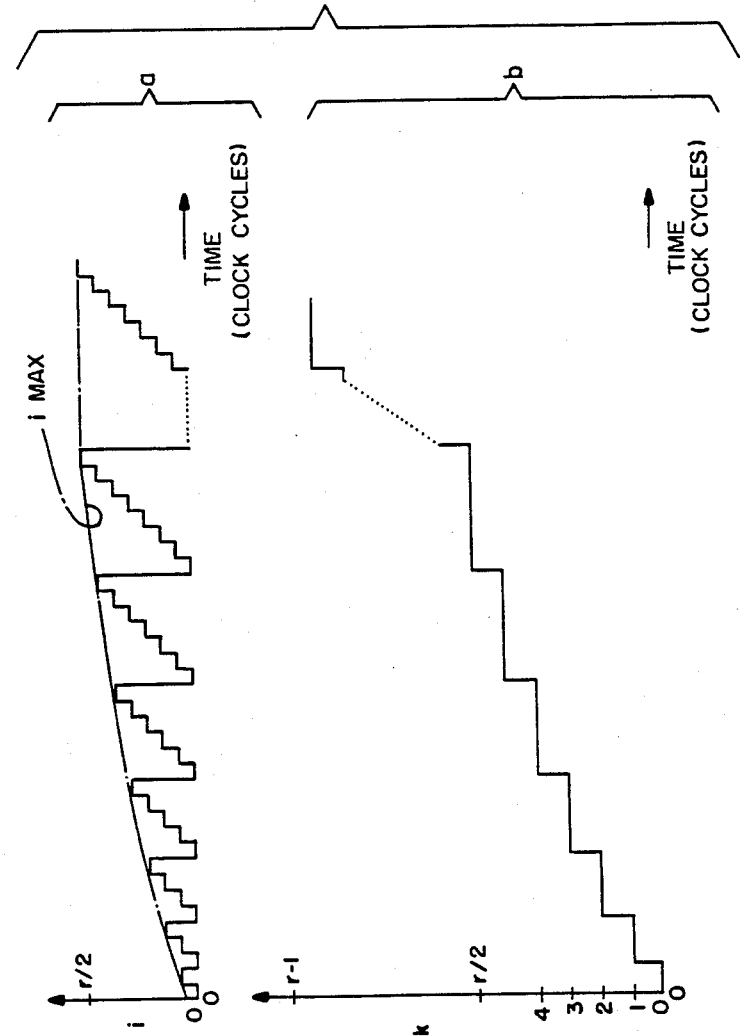
FIGS. 10a-10b are timing diagrams illustrating the operation of the system of FIG. 9.

FIGS. 10a and 10b illustrate the progression of the memory address index i with respect to the iteration index k (the number of algorithm iterations) as a function of time. For each value of the iteration index k, (i.e., during iteration k) the memory address index i is incremented during successive memory access cycles so as to address each of the polynomial coefficients in each of the RAM's 200, 204 in succession. With each step increase in the address index i, a successive one of the coefficients in each of the RAM's 200, 204 is unloaded. The corresponding memory location is then "updated" with the next iterative approximation, until the entire contents of each of the polynomial RAM's 200, 204 has been so "updated". Then, the $k+1^{st}$ iteration begins. During each algorithm iteration, the degree of each of the polynomials $\sigma(z)$, $\omega(z)$, $\tau(z)$, $\alpha(z)$ increases by one, at most. As mentioned previously, the number of correctable errors cannot exceed half the number of check bytes, r/2. Therefore, the number of roots —and thus the degree— of the error locator polynomial $\sigma(z)$ cannot exceed r/2. Accordingly, the maximum number of coefficients stored in each of the RAM's 200, 202, 204, 206—and and thus the maximum range of i—is r/2. It follows that i is incremented from 0 to r/2 during each algorithm iteration k. As k grows, $i_{max}$ increases once each cycle, starting at 1, up to a maximum amount not exceeding r/2. Then, $i_{max}$ remains at that level through the conclusion of the algorithm, as illustrated in FIG. 10.

Computation of the Error Evaluator Polynomial

The identical operation occurs between the ω-RAM 202 and the γ-RAM 206, the identical type of architecture being associated with the two RAM's 202, 206 as with the first two RAM's 200, 204. Thus, ω(z) is generated in the same manner as σ(z).

Computation of the Character $\Delta_{(k)}$

The character $\Delta_{(k+1)}$ to be used during the next $(k+1^{st})$ iteration is computed during the operation of the $k^{th}$ iteration just described. (This computation is therefore, in effect, the "first" step of the next iteration, as indicated in FIG. 5.) Unlike the "brute force" approach of FIG. 6, however, multiplication of all terms of the two polynomials S(z) and $\sigma_{(k+1)}(z)$ need not be performed. Instead, the serial architecture of the improved version of the syndrome processor 4 of FIG. 9 provides a dramatic shortcut by recognizing the symmetry of the coefficient of $z^{k+2}$ in the product of the two polynomials, as illustrated in FIG. 12a. Specifically, because $\Delta_{(k+1)}$ is the coefficient of $z^{k+2}$ in $\sigma_{(k+1)}(z) \times S(z)$, it is readily derived by multiplying individual coefficients of σ(z) and S(z) in ascending and descending degrees of z, respectively, as long as the sum of the order of each coefficient pair is always k+2. This process is depicted as a convolution in FIG. 12b for the case k=2. Using FIG. 12a as the definition of the character $\Delta_{(k+1)}$, the syndrome processor of FIG. 9 addresses the S-RAM 208 in descending order of the index i simultaneously with the σ-RAM 200 being addressed in ascending order of the index i. The S-RAM 208 is addressed by the address index k+3−i (as illustrated in FIG. 9). Simultaneously, a delay flip-flop 212 furnishes the coefficient $\sigma_{(k+1)i-1}$. (The delay of the flip-flop 212 is equal to one memory access cycle). (Introduction of the delay flip-flop 212, which dictates the choice k+3−i for the address index, advantageously relaxes system timing requirements.) A multiplier 230 multiplies each coefficient pair read out of the two RAM's 200, 208. As the index i is incremented from zero to $i_{max}$ (as illustrated in FIG. 10a), the products generated by the multiplier 230 are accumulated in an accumulator 232. Accordingly, each time the address index i reaches its maximum value $i_{max}$, the accumulator 232 contains the sum of the coefficients of $z^{k+2}$ in the product $S(z) \times \sigma_{(k+1)}(z)$, as depicted in FIG. 12a. This sum is the desired character $\Delta_{(k+1)}$.

Referring to FIG. 9, during iteration k, the $k+1^{st}$ iteration of the character Δ, namely $\Delta_{(k+1)}$, is being accumulated in the accumulator 232, and a delay flip-flop 234 reads out the previous iteration of Δ, namely $\Delta_{(k)}$ for use during the $k^{th}$ iteration just described. Immediately thereafter, $\Delta_{(k+1)}$ is furnished by the flip-flop 234 for use during the next $(k+1^{st})$ iteration. (The delay of the flip-flop 234 is equal to one algorithm iteration.)

The computation of $\Delta_{(k+1)}$ is really a computation of the coefficients of $z^{k+2}$, requiring that the sum of the orders of each pair of multiplied coefficients of σ(z) and S(z) always be k+2, as mentioned previously in connection with FIG. 12.

Timing Control Signals

Each of the various index and control signals illustrated in FIG. 9, namely i, i−1, k, i$\overset{?}{=}$0, i$\overset{?}{=}i_{max}$, k$\overset{?}{=}$0 and k+3−i may be generated, in accordance with the relative progression of i and k shown in FIGS. 10a and b, by a programmable read only memory (PROM) 250 under the control of a modulus n counter 252, or other means, readily implemented by the skilled worker. As mentioned previously, n is the number of bytes in each codeword.

Preferred Embodiment

Figure 1:
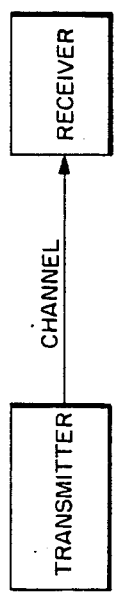
FIG. 1 is a simple block diagram illustrating a communication channel.
Figure 2:
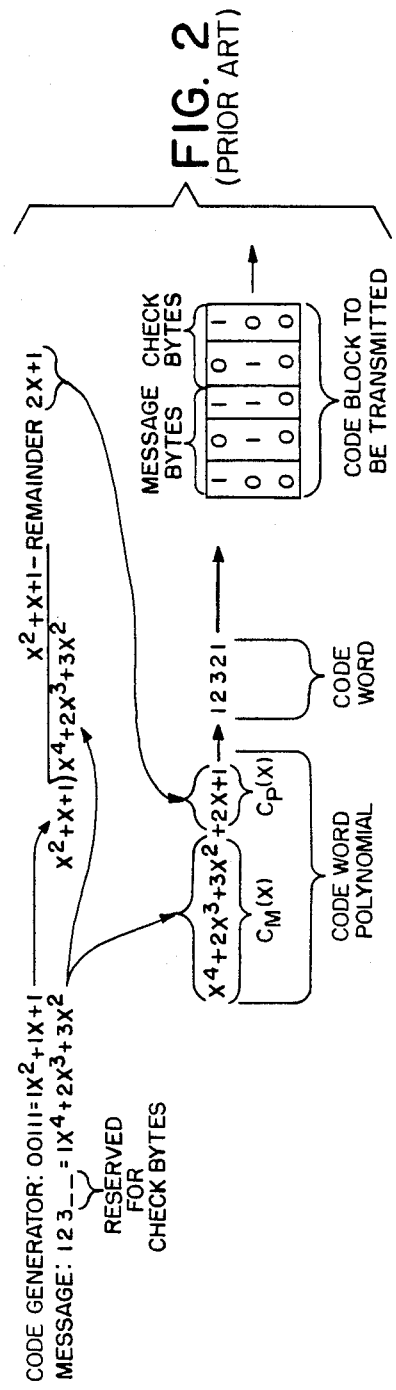
FIG. 2 illustrates a highly simplified algebraic coding problem.
Figure 3:
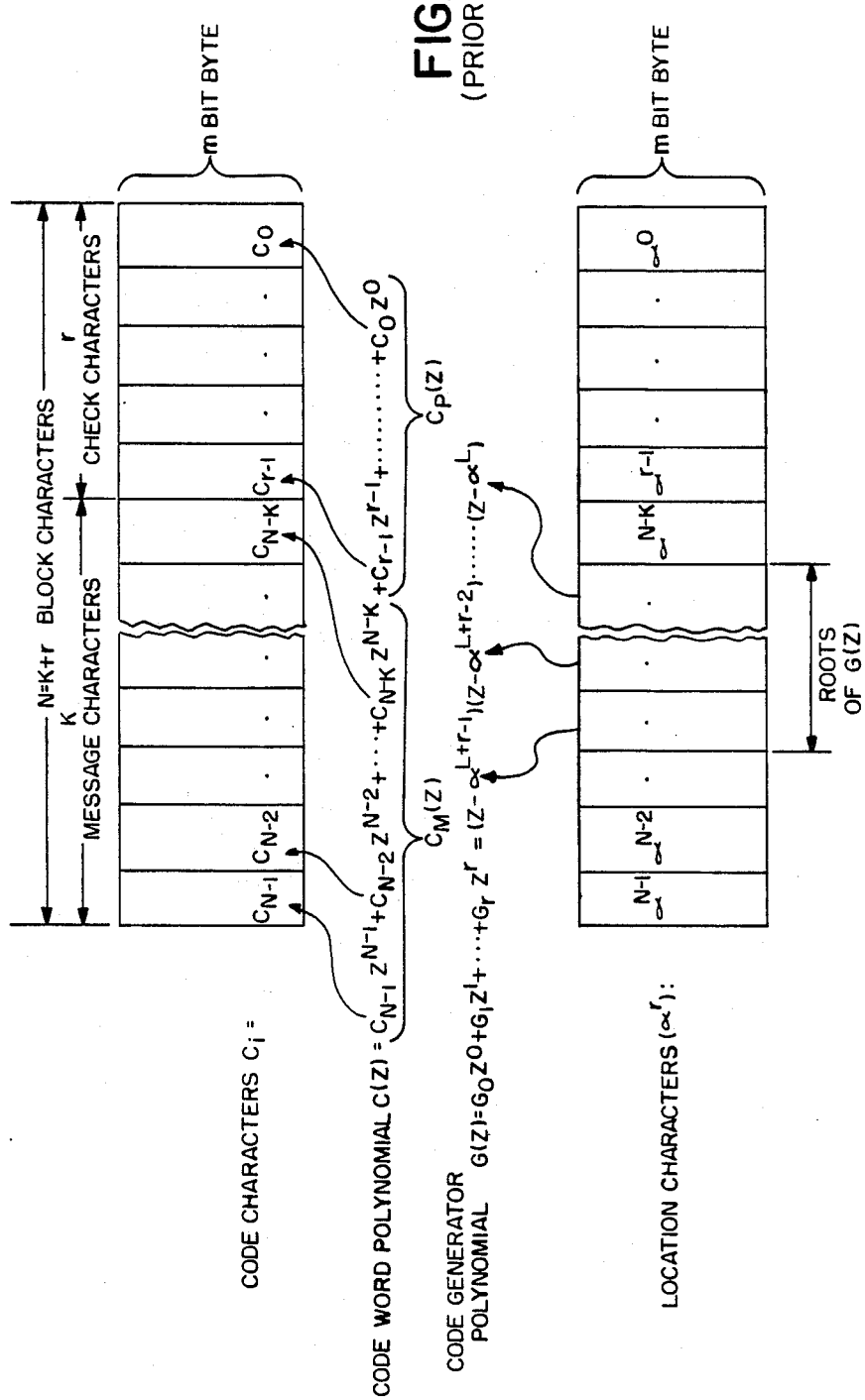
FIG. 3 is a block diagram illustrating the data format used in a block error correction code.
Figure 4:
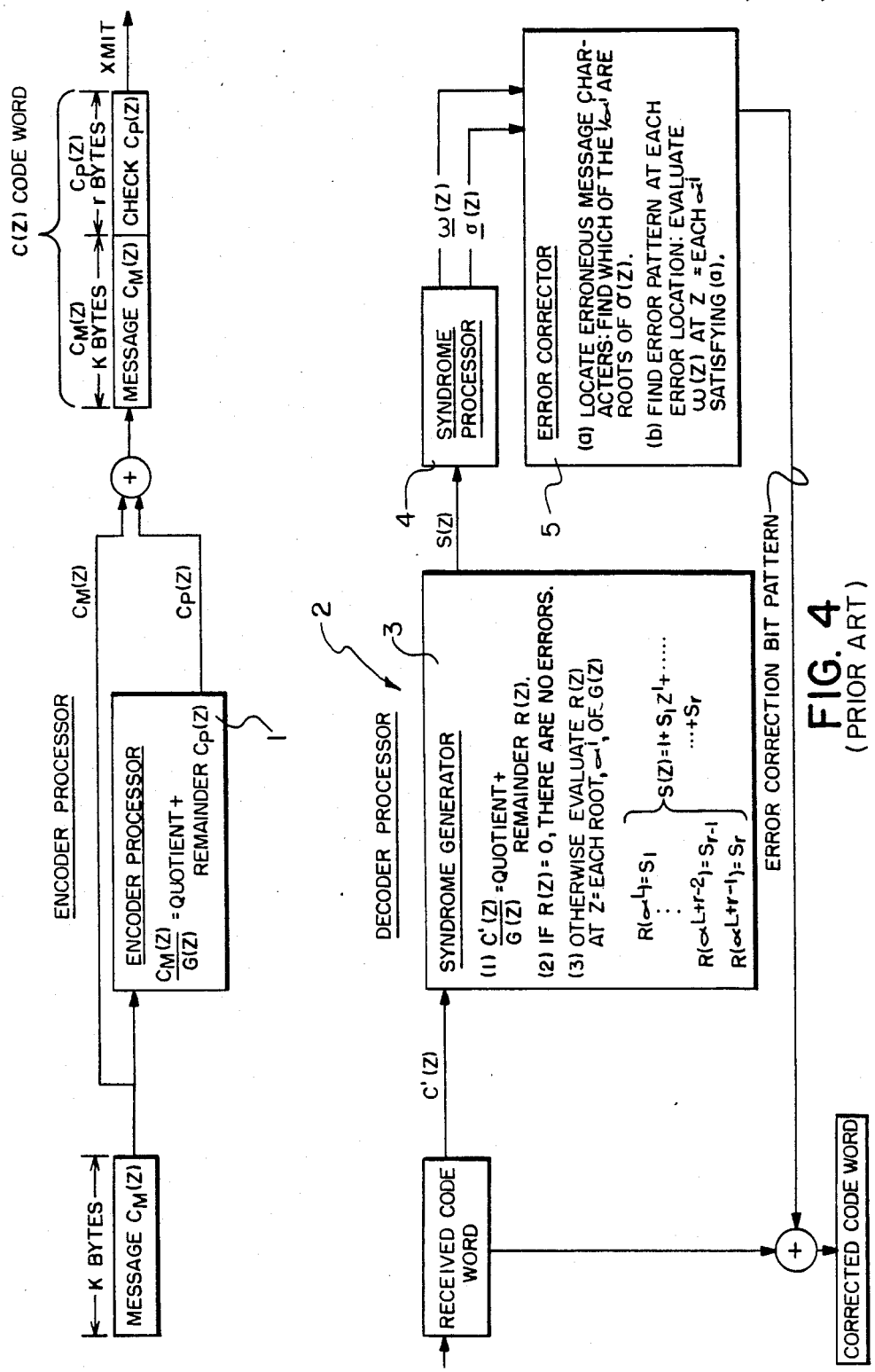
FIG. 4 is a block diagram illustrating block error correction of the prior art.

It will be recalled from FIG. 4 that the decoder processor 2 includes a syndrome generator 3 and a syndrome processor 4 to generate the error location polynomial σ(z) and the error evaluation polynomial ω(z). As previously described in reference to FIG. 4, the syndrome generator 3 generates the syndrome polynomial S(z) by evaluating the remainder polynomial R(z) at the r roots of the code generator polynomial G(z). The disadvantage of the approach of FIG. 4 is that generation of the syndrome polynomial S(z) from the remainder polynomial R(z) is troublesome and time consuming.

Figure 13:
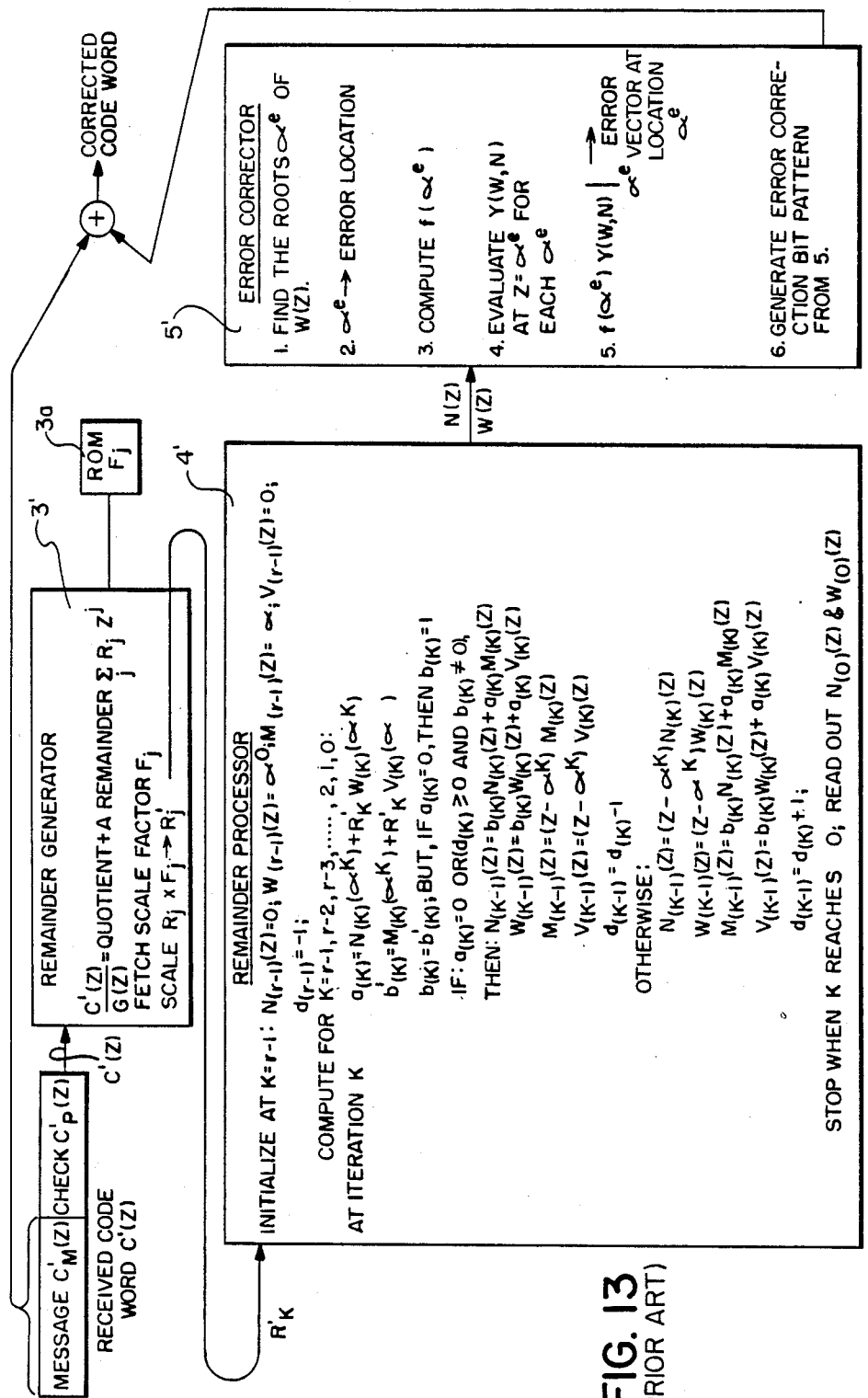
FIG. 13 illustrates an error correction system employing the Welch-Berlekamp algorithm.

In the preferred embodiment of the invention, generation of the syndrome polynomial S(z) from the remainder polynomial R(z) is not required. Instead, error detection and correction is performed by directly operating on the remainder polynomial R(z) only, without requiring generation of a syndrome polynomial S(z) therefrom, in accordance with the Welch-Berlekamp algorithm disclosed in U.S. Pat. No. 4,633,470 to Welch and Berlekamp. Thus, the syndrome generator 3 and the syndrome processor 4 are unnecessary. Instead, the preferred embodiment of the decoder processor 2, illustrated in FIG. 13, includes a remainder generator 3' and a remainder processor 4'. The error corrector 5' of FIG. 13 is similar to the error corrector 5 of FIG. 4, with some minor differences to be described below. The remainder generator 3' of FIG. 13 operates in the manner described previously in connection with FIG. 4 to generate a remainder polynomial from the received codeword polynomial C'(z). The remainder generator 3' then scales each coefficient $R_k$ of the remainder polynomial R(z) by a scale factor $F_k$ which has been precomputed and stored in a read only memory 3'a. Computation of each scale factor $F_k$ will be described later in this specification. The scaled remainder polynomial coefficients $R'_k$ are transmitted to the remainder processor 4'.

Welch-Berlekamp Algorithm

As shown in FIG. 13, the remainder processor 4' executes the Welch-Berlekamp algorithm in a manner reminiscent of the one executed by the syndrome processor 4 of FIG. 5. Specifically, recursive approximations to four polynomials are simultaneously computed in successive iterations. In the Welch-Berlekamp algorithm executed by the remainder processor 4', the four polynomials are N(z), W(z), M(z) and V(z). The polynomial N(z) is the error locator polynomial whose roots $a^i$ are the location vectors of the erroneous bytes in the received block. The polynomial W(z) is the error evaluator polynomial, and plays a role similar to that of the error evaluator polynomial ω(z) of FIG. 5. In FIG. 13, as in FIG. 5, the subscripts in parentheses of $N_{(k)}(z)$ denotes the $k^{th}$ iterative approximation to the polynomial N(z). In FIg. 13, as in FIG. 5, the iteration index is k, with the difference in FIG. 13 that k starts at its maximum value, r−1 and is decremented to zero (while in FIG. 5, it will be recalled, the iterative index k was incremented from zero to its maximum value).

The initial conditions shown at the top of the remainder processor 4' of FIG. 13 are analogous to those stated in the algorithm of FIG. 5. As in FIG. 5, in FIG. 13 the computation for the $k^{th}$ iteration step is illustrated within the processor 4'. The $k^{th}$ iteration step begins with the computation of two m-bit characters $a_{(k)}$ and $b_{(k)}$. The character $a_{(k)}$ is simply the sum of the present iterative approximation to the polynomial N(z) evaluated at $z=\alpha^k$ (this quantity being denoted as $N_{(k)}(\alpha^k)$), plus the present iterative approximation to the polynomial W(z) evaluated at $z=\alpha^k$ multiplied by the $k^{th}$ coefficient of the scaled remainder polynomial R(z) (this entire latter quantity being denoted $R'_{(k)}W_{(k)}(\alpha^k)$). The computation of $b_{(k)}$ is analogous and includes an additional simple logic function illustrated in FIG. 13. Computation of the next iterative approximation to the four polynomials N(z), W(z), M(z), V(z) is then performed in one of two branches, labeled "THEN" and "OTHERWISE", in FIG. 13, the choice between the branches being determined by an "IF" test illustrated in FIG. 13. Significantly, the computation of each polynomial involves either a simple multiplication by one of the characters a, b, or multiplication by the variable z, depending upon the outcome of the "IF" test.

A detailed description of the Welch-Berlekamp algorithm of FIG. 13 is given in U.S. Pat. No. 4,633,470 to Welch and Berlekamp, and need not be described further herein. It is sufficient to state that, after the iteration index k has regressed from r−1 down to zero, the algorithm is complete. At this point, the remainder processor 4' ceases operation and reads out the last iterative approximations of the error locator polynomial, $N_{(0)}(z)$ and the error evaluation polynomial, $W_{(0)}(z)$, to the error corrector 5'. Because the operation of the error corrector 5' is analogous to that of the error corrector 5 of FIG. 4, further description of its operation will be postponed and the discussion will now concentrate on implementation of the Welch-Berlekamp remainder processor 4' in accordance with the present invention.

Remainder Processor

Figure 14A:
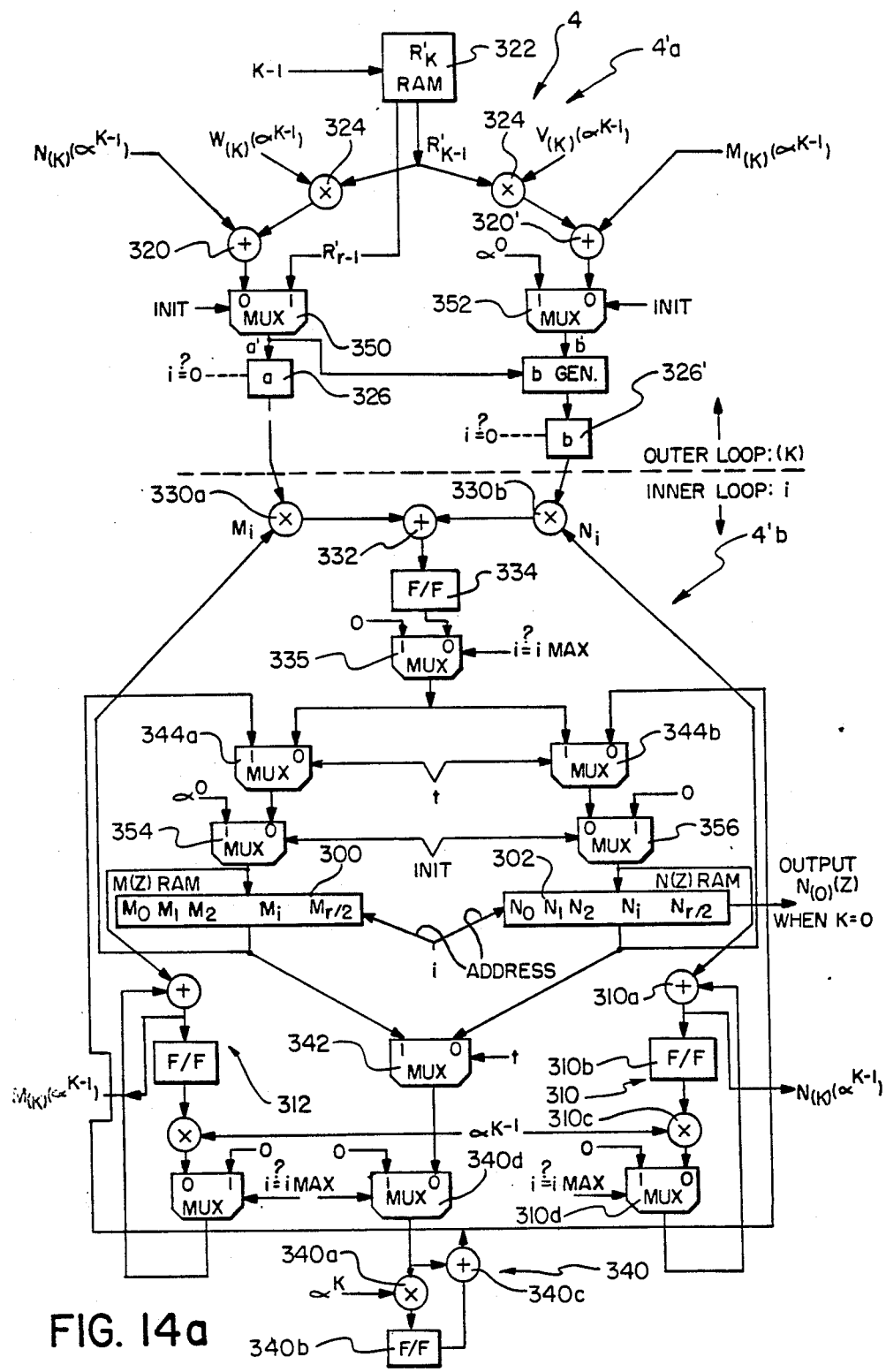
FIGS. 14a-14b-14c illustrate a second embodiment of the invention employed in the system of FIG. 13.
Figures 14B, 15:
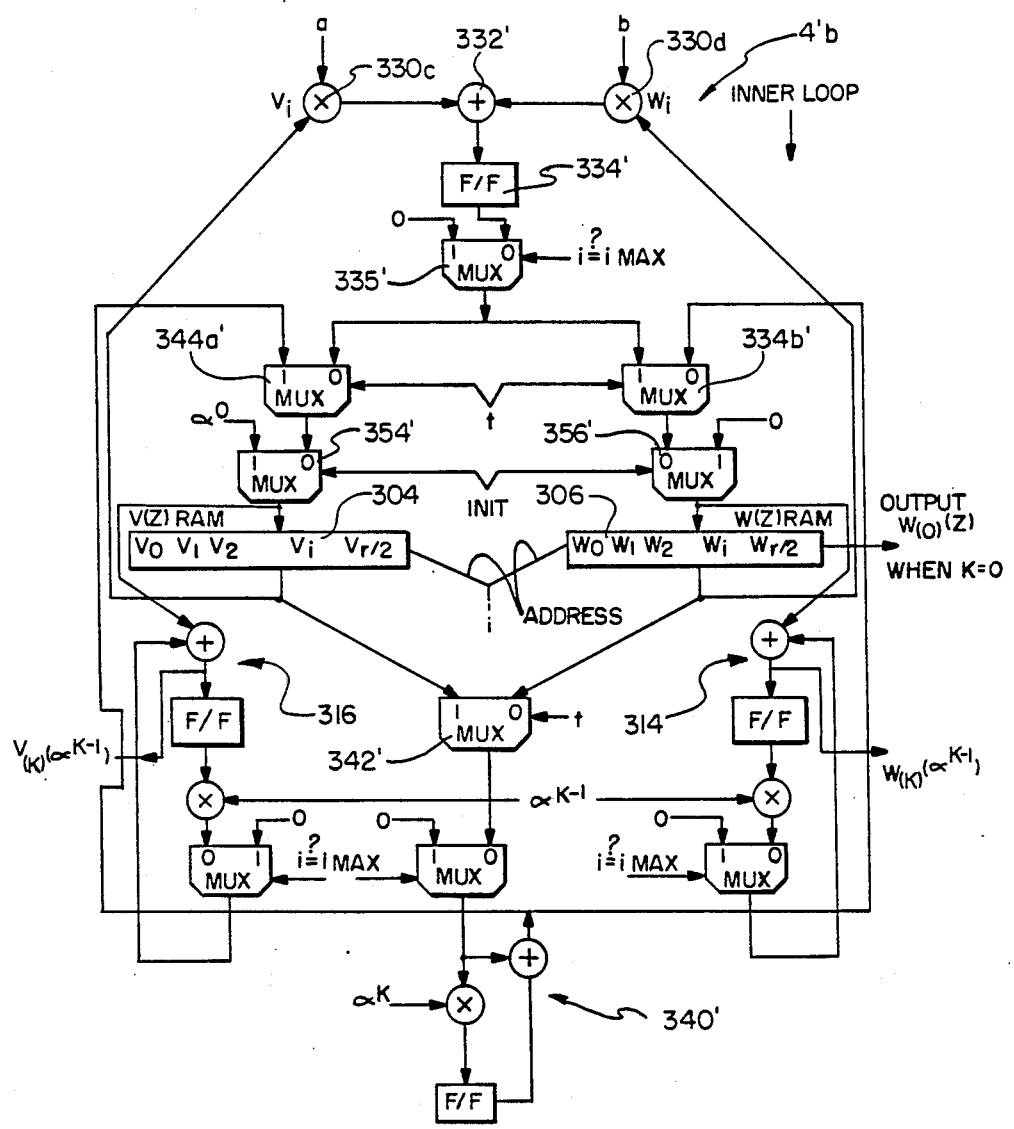
FIG. 15 illustrates an algebraic technique employed in the system of FIGS. 14a-14b-14c.

Referring to FIGS. 14a and 14b, the remainder processor 4' includes four RAM's 300, 302, 304, 306 storing the individual m-bit coefficients of the polynomials M(z), N(z), V(z), W(z), respectively. The contents of the four RAM's 300, 302, 304, 306 change as each iteration of the algorithm of FIG. 13 is executed by the syndrome processor 4'. The four polynomial RAM's of FIGS. 14a and 14b store each individual polynomial coefficient in an individually addressable memory location. As shown in FIG. 13, operation of the remainder processor 4' begins by establishing the initial values of the four polynomials N(z), W(z), M(z), V(z), a number d, and the two m-bit characters, a and b. Preferably, the algorithm begins with k being set to its maximum value, r−1, and proceeds by decrementing k once with each iteration of the algorithm. The following description of the serial Galois remainder processor 4' of FIGS. 14a, b and c, of the present invention begins with its execution of the $k^{th}$ iteration of the algorithm of FIG. 13. Referring now to FIG. 13, the first two steps of the $k^{th}$ iteration comprise the computations of the characters $a_{(k)}$ and $b_{(k)}$ respectively. These computations are performed in a sub-processor 4'a shown at the top of FIG. 14a.

Serial Polynomial Evaluators

In order to generate the m-bit characters $N_{(k)}(\alpha^k)$, $W_{(k)}(\alpha^k)$, $M_{(k)}(\alpha^k)$, $V_{(k)}(\alpha^k)$ required in the computations of $a_{(k)}$ and $b_{(k)}$ shown in FIG. 13, each of the polynomials stored in a respective one of the RAM's 300, 302, 304, 306 is first evaluated in a respective one of four polynomial evaluators 310, 312, 314, 316. During the $k^{th}$ iteration step, each of these evaluators, in effect, sets the independent variable z to equal the location character $\alpha^{k-1}$, evaluates the respective polynomial at that point to generate an m-bit character, and furnishes this m-bit character to the sub-processor 4'a. It should be recalled here that $\alpha^{k-1}$ is the $k-1^{st}$ root of the generator polynomial G(z). In order to evaluate the polynomial N(z) (for example), its m-bit coefficients are read from the N(z)-RAM 302 one-at-a-time (one coefficient each memory access cycle) and fed to the corresponding polynomial evaluator 310. For this purpose, the address index i applied to the N(z)-RAM 302 is decremented once each memory access cycle.

The polynomial evaluator 310 is typical of the four polynomial evaluators 310, 312, 314, 316 associated with the RAM's 300, 302, 304, 306 respectively. It operates in serial fashion in accordance with the architecture of the present invention, so as to avoid a proliferation of hardware. The polynomial evaluator 310 operates in synchronism with the serial addressing of the RAM 302 by the address index i. Operation of the polynomial evaluator 310 takes advantage of Horner's rule for evaluating a polynomial without resorting to powers of the independent variable z, as shown in FIG. 15. The usual power sum expression for the polynomial N(z) given on the left-hand side of FIG. 15 may be expressed in accordance with the expression shown on the right-hand side of FIG. 15, which requires only a knowledge of z (as distinguished from $z^2, z^3, \ldots, z^i$) and (of course) a knowledge of each of the coefficients $N_i$.

Significantly, unlike the embodiment of FIG. 9, the address index i of FIG. 14 is decremented once each memory access cycle, beginning at its maximum value r/2, rather than being incremented. Each successive coefficient $N_i$ read out from the RAM 302 is applied within the polynomial evaluator 310 to an adder 310a. The output of the adder 310a is applied to a delay flip-flop 310b whose output in turn is multiplied by $\alpha^{k-1}$ in a multiplier 310c. The output of the multiplier 310c is applied (through a multiplexer 310d) to the other input of the adder 310a.

The delay flip-flop 310b operates on the principle discussed earlier in connection with the delay flip-flop 210 of FIG. 9 so as to, in effect, "shift" the polynomial coefficients in accordance with a multiplication of the polynomial N(z) by the independent variable z. Accordingly, the delay of the flip-flop 310b equals one memory access cycle, that is, the period of each successive decrementing of the memory address index i.

Referring to the last term in the expanded polynomial expression on the right-hand side of FIG. 15, the delay flip-flop 310b contains the result, $N_{i+1}+ \ldots$, of the computation made by the polynomial evaluator 310 during the previous ($i+1^{st}$) memory access cycle. This previous result is multiplied in the multiplier 310c by the character $\alpha^{k-1}$ to generate the quantity $\alpha^{k-1}(N_{i+1}+ \ldots)$, which quantity is then added by the adder 310a with the current polynomial coefficient $N_i$ now being unloaded from the RAM 302 during the current ($i^{th}$) memory access cycle. The output of the adder 310a thus yields the quantity $N_i + \alpha^{k-1}(N_{i+1} + \ldots)$. Thus, the Horner's rule expression for $N(z)$ (on the right side of FIG. 15), in effect, "grows" in the evaluator 310, beginning with the terms in the inner-most parentheses.

The polynomial evaluator 310 completes the evaluation of the polynomial $N_{(k)}(z)$ stored in the RAM 302 after the address index i has been decremented from its maximum value (r/2) down to zero. At the completion of this process, the flip-flop 310b contains the m-bit character $N_{(k)}(\alpha^{k-1})$, which is the $k^{th}$ iterative approximation to the polynomial $N(z)$ evaluated at $z = \alpha^{k-1}$. This result is applied to the input of an adder 320 in the sub-processor 4'a.

The serial process performed by each of the other polynomial evaluators 312, 314, 316 is the same as that just described and need not be described further. Each of the characters $N_{(k)}(\alpha^{k-1})$, $W_{(k)}(\alpha^{k-1})$, $V_{(k)}(\alpha^{k-1})$ and $M_{(k)}(\alpha^{k-1})$ is thus generated in a respective one of the polynomial evaluators 310, 314, 316 and 312.

Sub-Processor 4a—Computation of $a_{(k)}$ and $b_{(k)}$

Continuing the description of the execution of the $k^{th}$ algorithm iteration, the sub-processor 4'a receives the $k-1^{st}$ scaled coefficient $R'_{k-1}$ of the remainder polynomial from a RAM 322 (which stores the scaled remainder coefficients generated by the remainder generator 3'). A multiplier 324 multiplies the scaled remainder coefficient $R'_{k-1}$ by the character $W_{(k)}(\alpha^{k-1})$ and furnishes the product to one input of an adder 320. The other input of the adder 320 receives the character $N_{(k)}(\alpha^{k+1})$. A similar process takes place (as illustrated in FIG. 14a) with the scaled remainder coefficient $R'_{k-1}$, the character $V_{(k)}(\alpha^{k-1})$ and the character $M_{(k)}(\alpha^{k-1})$ through a multiplier 324' and an adder 320'. The output of the adder 320 constitutes the m-bit character $a_{(k)}$. The output of the adder 320' constitutes a preliminary version, $b'_{(k)}$, of the character $b_{(k)}$. The transformation between b' and b is accomplished by a b-generator logic circuit shown in FIG. 14c. The characters $a_{(k)}$ and $b_{(k)}$ are stored in registers 326 and 326' respectively, whose outputs constitute the output of the sub-processor 4'a. The arithmetic operations just described occur once with each iteration of the algorithm of FIG. 13. Thus, the contents of the registers 326, 326' change each time the iteration index k is decremented. The outputs of the flip-flops 326, 326' are applied to a serial sub-processor 4'b.

Sub-Processor 4'b—Serial Architecture

A portion of the sub-processor 4'b and its serial architecture has already been described, namely the four polynomial RAM's 300, 302, 304, 306 and their corresponding polynomial evaluators 312, 310, 316, 314, respectively. A portion of the sub-processor 4'b is illustrated in FIG. 14a while the rest of it is illustrated in FIG. 14b.

As previously described herein, at the beginning of the $k^{th}$ iteration of the algorithm of FIG. 13, the address index i is decremented from its maximum value once each memory access cycle, down to zero. Thus, during each memory access cycle the $i^{th}$ coefficient stored in the $i^{th}$ address location in each of the RAM's 300, 302, 304, 306 is read out. Each time the address index i is decremented, the next one of the polynomial coefficients is read out from its respective RAM and multiplied by a respective one of multipliers 330a, 330b, 330c, 330d by a respective one of the coefficients $a_{(k)}$ or $b_{(k)}$, as illustrated in FIGS. 14a and 14b. The products of multiplier pairs 330a, 330b and 330c, 330d are combined in adders 332, 332' respectively, and sent to registers 334, 334' respectively.

Polynomial Multipliers

Referring to the Welch-Berlekamp algorithm illustrated in FIG. 13, it is seen that each of the two branches (labeled in FIG. 13, respectively, as "THEN" and "OTHERWISE") requires a multiplication of a corresponding one of two pairs of the polynomials by the term $(z - \alpha^k)$ to complete the $k^{th}$ iteration of the algorithm. This multiplication is carried out by serial polynomial multipliers 340 in FIG. 14a and 340' in FIG. 14b, whose operation will now be described by reference to polynomial multiplier 340 of FIG. 14a only.

For each decrementing of the address index i, one or the other of the currently unloaded coefficients $M_i$ or $N_i$ from the RAM 300 or 302, respectively, is selected by a multiplexer 342 and applied to the serial polynomial multiplier 340, depending upon whether a variable t (to be defined later herein) is one or zero. The selection thus performed by the multiplier 342 implements the "IF" test of FIG. 13 to choose one of the two branches labeled "THEN" and "OTHERWISE". The resulting product generated by the serial polynomial multiplier 340 is then loaded through a respective one of two multiplexers 344a, 344b, to the same RAM address location from which the selected one of the coefficients $M_i$, $N_i$ was just unloaded.

The serial polynomial multiplier 340 first multiplies the incoming coefficient $N_i$ by the character $\alpha^k$ by means of a Galois field multiplier 340a. The result is applied to the input of a delay flip-flop 340b. The purpose of the delay flip-flop 340b is the same as that discussed previously in connection with the delay flip-flop 210 of FIG. 9 and the principle illustrated FIG. 11, in which polynomial multiplication by the independent variable z is implemented by simply "shifting" the coefficients of that polynomial by one power of z, or, equivalently, by one address location in RAM. Thus, the delay of the flip-flop 340b is equal to exactly one memory access cycle, so that its output corresponds to the product $\alpha^k N_{i+1}$ ($N_{i+1}$ being the coefficient of $N(z)$ unloaded during the *previous* memory access cycle). This output is combined by a Galois field adder 340c with the coefficient $N_i$ unloaded during the current memory access cycle. The output of the adder 340c is the coefficient of $z^i$ in the polynomial $(z - \alpha^k)N_{(k)}(z)$ (which is just the desired result).

The multiplexers 342, 344a, 344b select one or the other of the two RAM's 300, 302 for this particular arithmetic operation, while selecting the other of the same two RAM's, 300, 302 to receive the contents of the register 334, depending upon whether the variable t is zero or one, respectively.

The identical operation occurs in the portion of the sub-processor 4'b illustrated in FIG. 14b (using the same drawing numerals in the figure except that a prime is added to the numeral), and need not be described further herein.

System Initialization

The purpose of multiplexers 350, 352, 354, 354', 356, 356' is to provide initial values for each of the variables at the beginning of the algorithm, in accordance with the initial conditions stated in FIG. 13. Whenever the logic signal "init" is a logic one (signifying initiation of the algorithm), then the multiplexer 350 furnishes the coefficient $R'_{r-1}$ in lieu of the polynomial evaluation character $N_{(k)}(\alpha^{k-1})$. Simultaneously, the multiplexer 352 furnishes the location character $\alpha^0$ in lieu of the polynomial evaluation $M_{(k)}(\alpha^{k-1})$. Also, at the same time the multiplexer 354 loads the RAM 300 with the location character $\alpha^0$ and the multiplexer 356 loads the RAM 302 with zero.

Initialization For The First Memory Access Cycle of Each Iteration

In order to guarantee that the sub-processor 4'b begins its execution of the first memory access cycle (at the beginning of each of the r iterations of the Welch-Berlekamp algorithm) with the proper initial values, multiplexers 335, 310d, 340d shown in FIG. 14a respond to the control signal $i \stackrel{?}{=} i_{max}$ to insert the m-bit zero character at appropriate points in the sub-processor 4'b. Specifically, the multiplexer 335 substitutes the m-bit zero character in lieu of the output of the delay flip-flop 334 during the first memory access cycle only. The multiplexer 310d substitutes the zero character in lieu of the output of the multiplier 310c in the evaluator 310 during the first memory access cycle.

A multiplexer similar to the multiplexer 310d is present in all of the other evaluators 312, 314, 316. The multiplexer 340d substitutes the zero character in lieu of the output of the multiplexer 342 to the polynomial multiplier 340 during the first memory access cycle. A multiplexer similar to the multiplexer 340d is present in the other polynomial multiplier 340' (FIG. 14b).

Minimization and Growth of Memory Access Cycle Range $i_{max}$

Figure 16A:
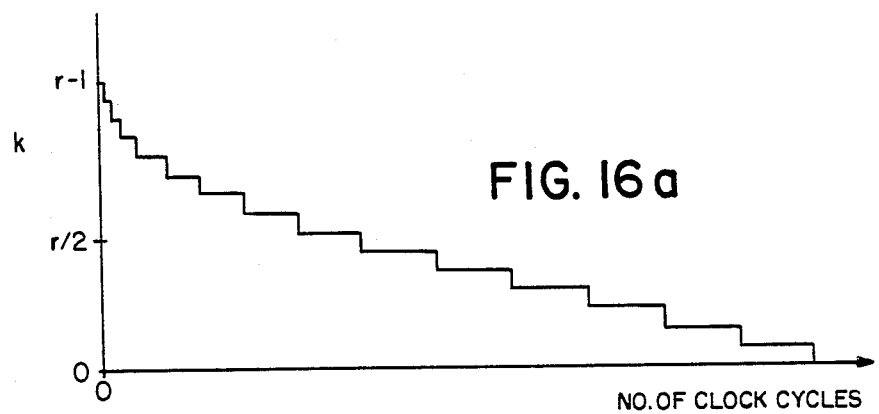
FIGS. 16a-16b-16c together comprise timing diagrams illustrated in the operation of the system of FIGS. 14a-14b-14c.
Figure 16B:
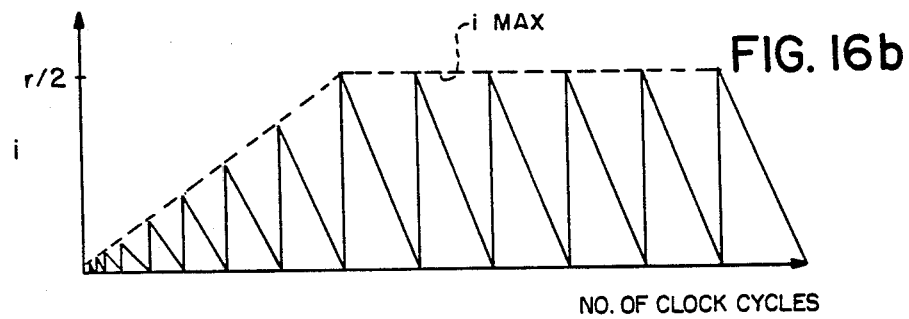
Figure 17:
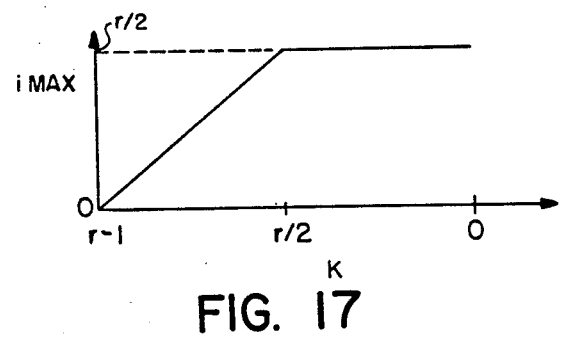
FIG. 17 is a timing diagram further illustrating the operation of the system of FIGS. 14a-14b-14c.

Each of the four polynomials stored in the RAM's 300, 302, 304, 306 grows at most by one degree in z with the completion of each iteration of the algorithm illustrated in FIG. 13. Thus, the degree of each of the polynomials is proportional to r−k. Accordingly, during the earlier iterations, when k is first being decremented from r−1, the degree of each of these polynomials is low, so that only the first few memory locations contain meaningful coefficients. In fact, the required number of coefficients to be read out of each RAM 200-206, to complete each serial polynomial evaluation and each serial polynomial multiplication, is proportional to r−k, the number of algorithm iterations completed. Therefore, a significant amount of processing time is saved in this invention by limiting the range $i_{max}$ of the address index i to not exceed the number of algorithm iterations completed at any given time. This is best illustrated in FIGS. 16a and 16b. As k is decremented with each iteration of the algorithm, as illustrated in FIG. 16a, the maximum range $i_{max}$ of the address index i is incremented. Thus, each iteration takes longer and longer as $i_{max}$ grows from one iteration to the next. This occurs until k reaches its halfway point at r/2. At precisely this point, $i_{max}$ reaches its maximum value, r/2. The degrees of the four iterative polynomials stored in the RAM's 300, 302, 304, 306 generally do not grow beyond r/2, since error correction theory dictates that the number of roots of the error locator polynomial N(z) cannot exceed one-half the number of check bit locations, r/2. FIG. 17 provides an alternative diagramatic correlation between the maximum value $i_{max}$ of the address index i and the iteration index k.

The advantage of thus limiting the maximum range, $i_{max}$, of the address index is that it saves a significant number of memory access cycle during the execution of the first half of the algorithm of FIG. 13 (by limiting its highest value to $i_{max}$) and during the second half (by limiting its highest value to r/2).

Storage of The Location Characters $\alpha^k$

Figure 14C:
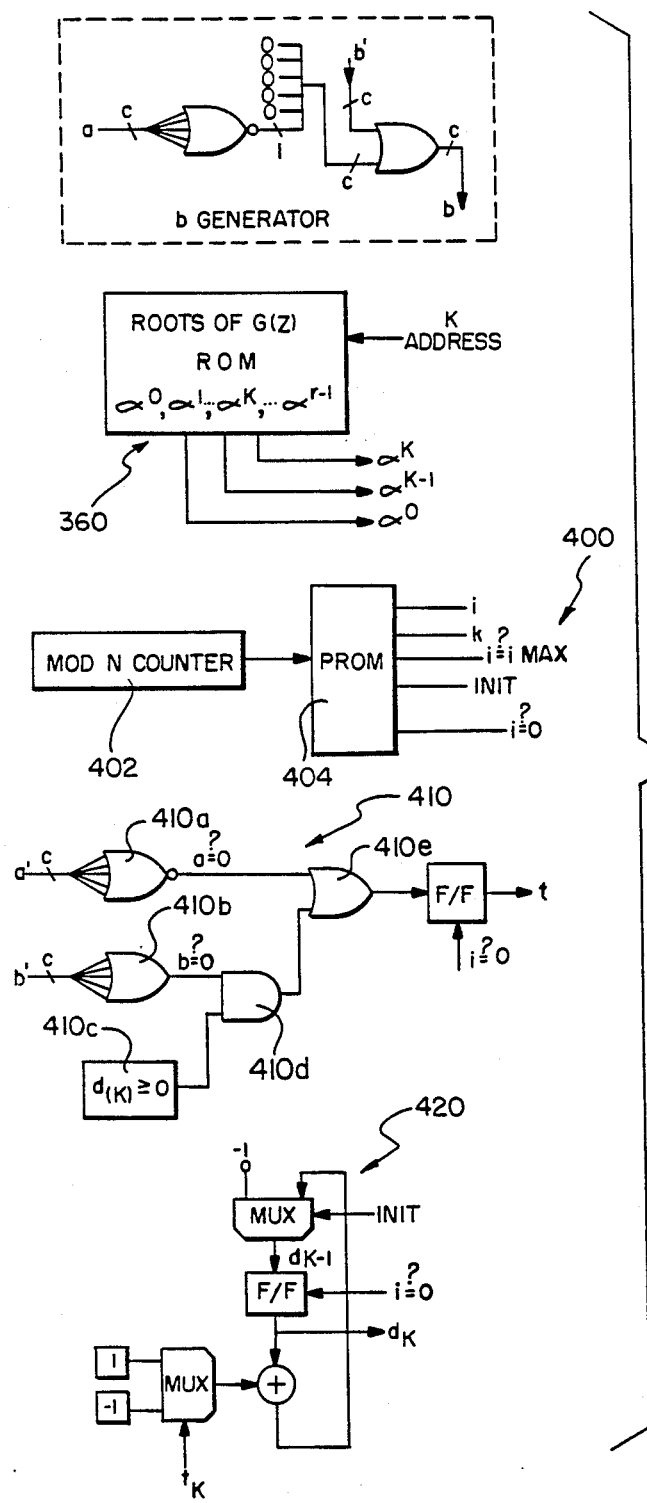

The various m-bit characters $\alpha^0$, $\alpha^k$, $\alpha^{k-1}$ are either "hardwired" or else fetched as needed from a ROM (read only memory) 360 (see FIG. 14c).

Control Logic

Figure 16C:
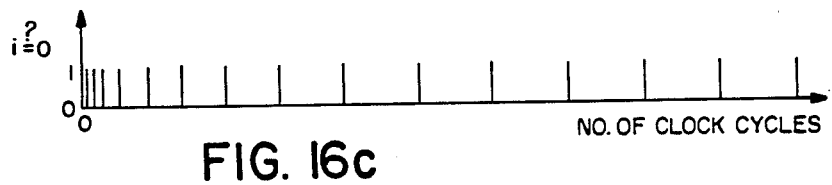

The address index i and the iteration index k are appropriately furnished during each iteration cycle by the control logic 400 illustrated in FIG. 14c. The control logic 400 includes a modulus n counter 402 stimulating a PROM 404 which furnishes the indices i, k in accordance with the cyclic sequence illustrated in FIG. 16a and 16b, while an "i=0" signal is generated in accordance with the sequence of FIG. 16c. The "init" signal is also generated by the PROM 404 at the beginning of the algorithm.

The control logic 400 further includes a t-generating circuit 410 which generates the logic signal t governing each of the multiplexers 334A, 334B and 342. These latter multiplexers implement the "IF", "THEN" or "OTHERWISE" branching illustrated in the Welch-Berlekamp algorithm of FIG. 13, as described previously. The t-generating circuit 410 includes an m-bit NOR gate 410a, which generates a logic "one" signal if the m-bit character $a_{(k)}$ is zero during a particular cycle k. The t-generating circuit 410 further includes an m-bit OR gate 410b which issues a logic one signal whenever the character $b_{(k)}$ is not zero during a particular algorithm cycle k. A test circuit 410c issues a logic one signal during any algorithm cycle k in which the variable $d_{(k)}$ is not less than zero. The outputs of the logic stages 410b and 410c are combined in an AND gate 410d, whose output is combined with the output of the NOR gate 410a in an OR gate 410d. The output of the OR gate 410e is the logic signal t (either a logic one or a logic zero). The the t-generating circuit 410 implements the logic statement "IF $a_{(k)}$ equals zero or if $b_{(k)}$ is not equal to zero and $d_{(k)}$ is greater than or equal to zero, then t equals one" (which is "IF" test of the algorithm of FIG. 13).

The t-generating circuit 410 operates cooperatively with a d-generating circuit 420. The d-generating circuit 420 generates the variable $d_{(k)}$ during each algorithm iteration cycle k. The d-generating circuit 420 simply increments or decrements the prior value $d_{(k+1)}$, depending upon the current value of t, to generate the next value $d_{(k)}$. This implements the last statements at the end of each of the two branches labeled "THEN" and "OTHERWISE" in the algorithm of FIG. 13, namely, "$d_{k-1}=d_k-1$" and "$d_{k-1}=d_k+1$", respectively.

Generic Building Blocks Of the Invention

Figure 18:
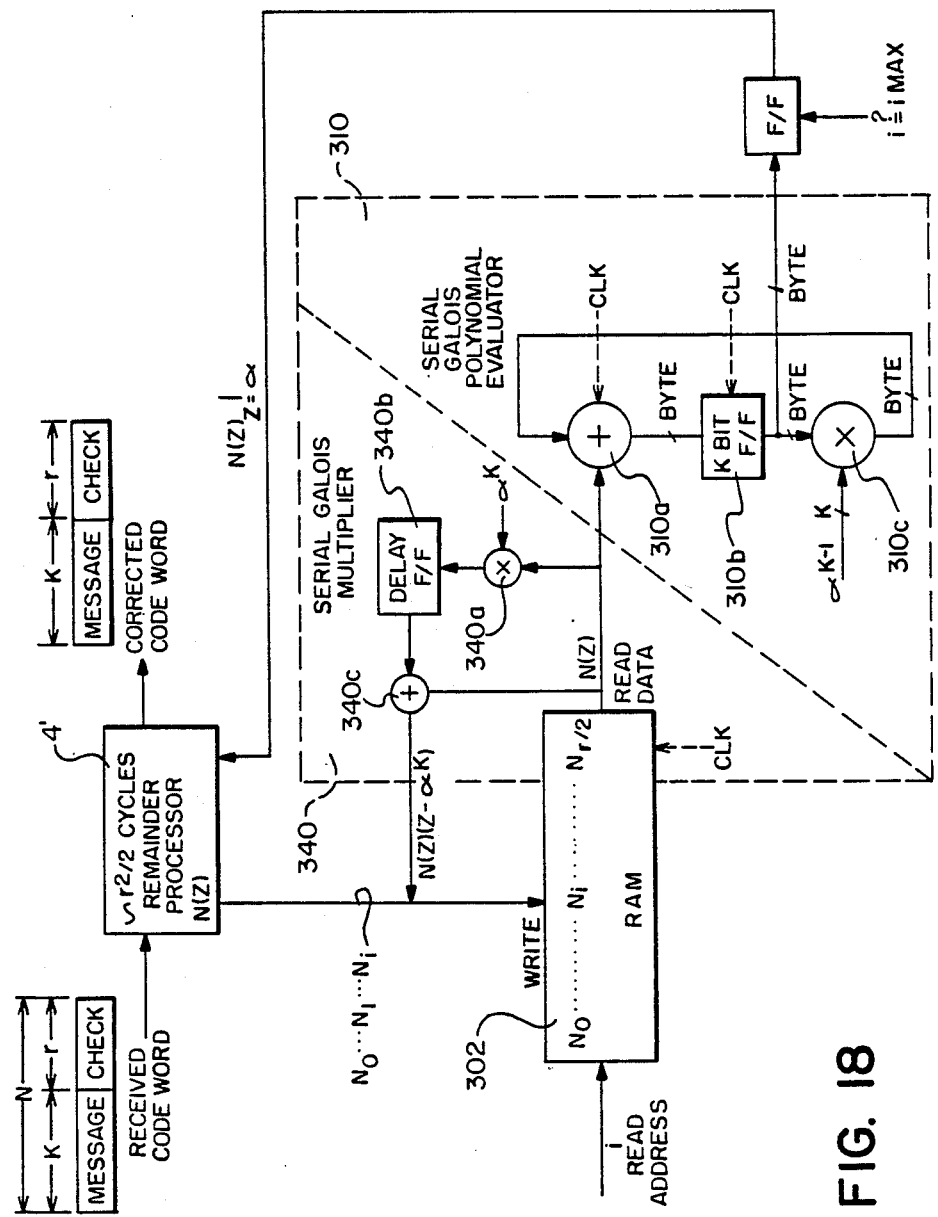
FIG. 18 illustrates one aspect of the system of FIGS. 14a-14b-14c in greater detail.

Some generic building blocks of the invention are illustrated separately in FIG. 18. The elements in FIG. 18 correspond identically to those illustrated in FIG. 14a and FIG. 14b, except that the serial Galois multiplier and serial Galois polynomial evaluator are separated and clearly labeled as such, for ease of comprehension.

Remainder Generator

Figure 19:
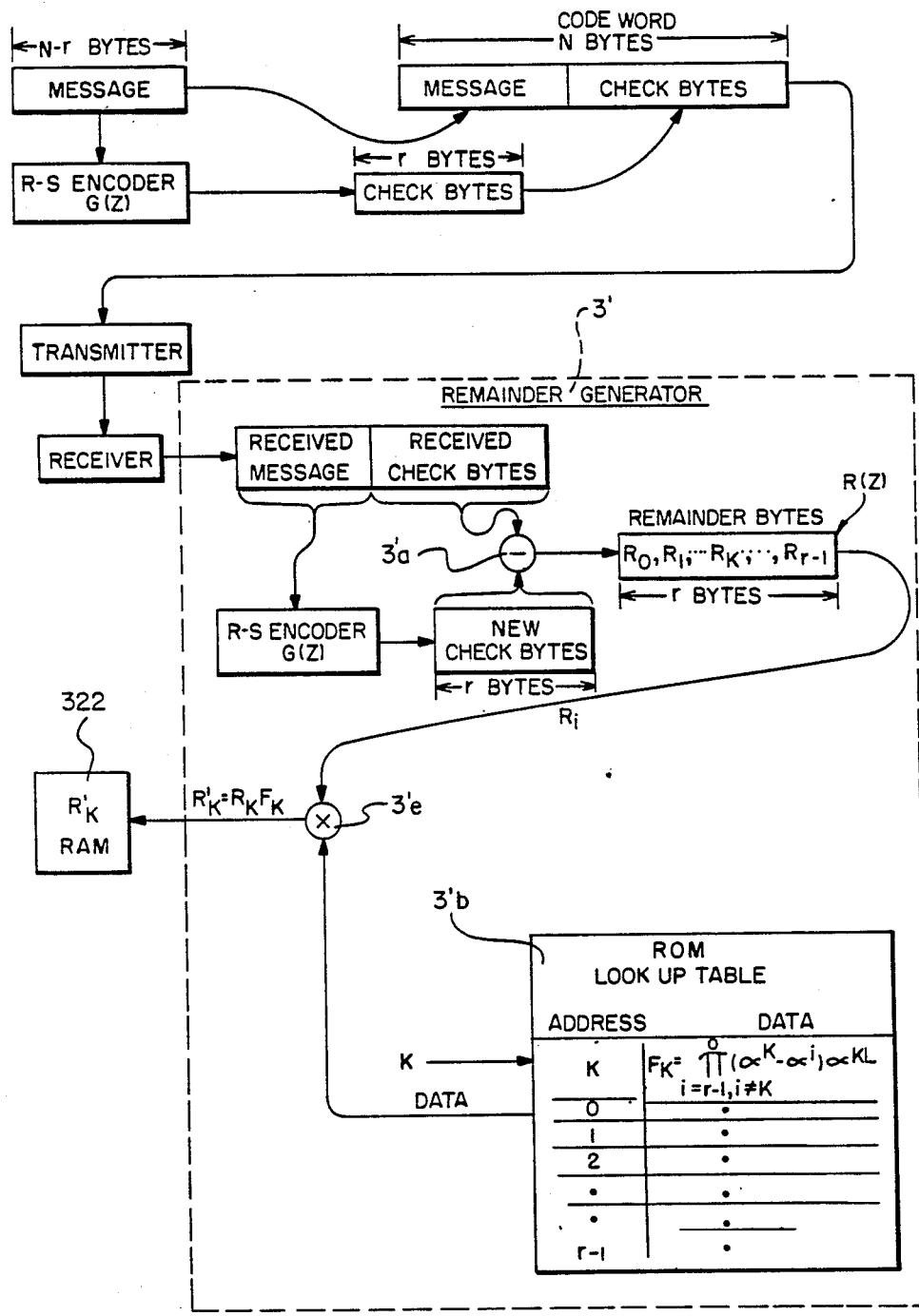
FIG. 19 illustrates the remainder generator employed in connection with the system of FIGS. 14a-14b-14c.

FIG. 19 illustrates the remainder generator 3' of FIG. 13 in greater detail. Specifically, it shows that the remainder polynomial R(z) is generated by subtracting the received check bits from the check bits locally generated from the received message bytes at a subtraction node 3'a. (If the difference is zero, the received data is error free.) FIG. 19 further illustrates the method of scaling each coefficient $R_k$ of the remainder polynomial R(z) by a factor $F_k$ stored in a read only memory 3'b. As illustrated in FIG. 19, the scale factors $F_k$ are pre-computed for each value of k in accordance with an expression solely dependent upon the generator polynomial G(z) and the various roots $\alpha^k$ of the generator polynomial G(z). The scaled remainder bytes $R'_k$, generated by the multiplier 3'e, are stored in the RAM 322, referred to previously in connection with FIGS. 14a and 14b.

Error Corrector

Figure 20:
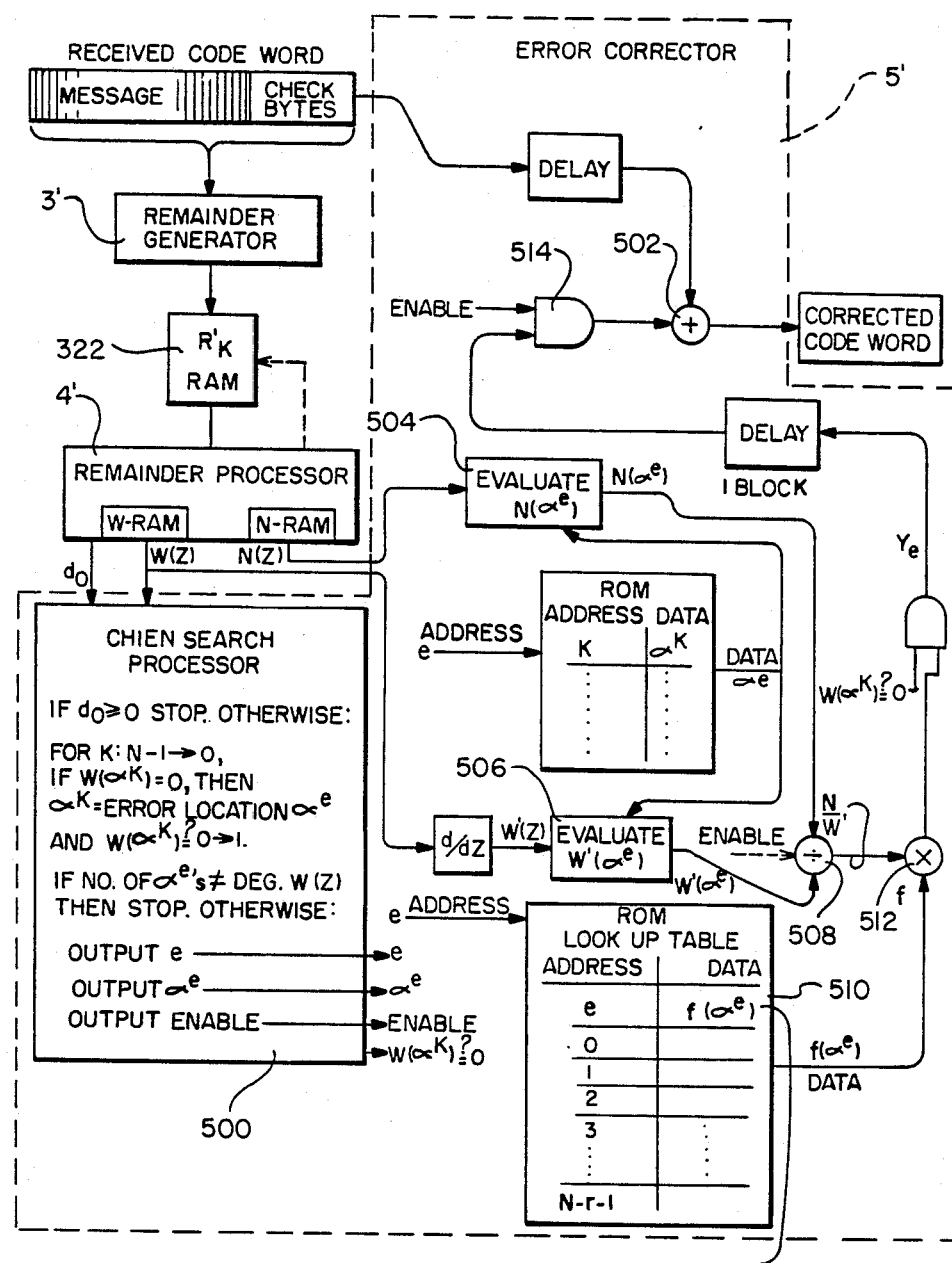
FIG. 20 illustrates a complete error correction system employing the system of FIGS. 14a-14b-14c.

FIG. 20 illustrates the error corrector 5' of FIG. 13 in greater detail. The error corrector 5' includes a Chien search processor 500. The technique of the Chien search is described in Berlekamp, *Algebraic Coding Theory*, Academic Press, 1968. In the present case, the Chien search processor 500 first determines whether the final value of d, i.e. $d_{(0)}$, is non-negative. As long as it is non-negative, there were no more than r/2 errors so that a proper N(z) and W(z) were found. Otherwise the Chien search processor 500 stops the process and flags an error. Next, the Chien search processor uses a trial and error method to determine which of the $\alpha^k$'s are the roots of the final version of the error locator polynomial $N_{(0)}(z)$. Any $\alpha^k$ which is found to be a root of $N_{(0)}(z)$ is labeled $\alpha^e$. If the total number of the roots $\alpha^e$ exceeds the degree of the error locator polynomial $N_{(0)}(z)$, then an error has occurred and the process is stopped. Otherwise, the Chien search processor 500 generates each of the roots, or error location characters, $\alpha^e$, and generates an ENABLE signal coinciding with the time of arrival of the corresponding codeword byte at a summing node 502.

The error corrector 5' includes polynomial evaluators 504 and 506, which evaluate the polynomial N(z) and the derivative of the polynomial W(z), respectively, at each of the roots $\alpha^e$ located by the Chien search processor 500. The results are divided in a divider 508 and multiplied by a factor $f(\alpha^e)$ fetched from a look-up table in a read only memory 510. The computation of the factor $f(\alpha^e)$ is as set forth in FIG. 20. For each possible $\alpha^e$, the corresponding vector $f(\alpha^e)$ is pre-computed and stored in the read only memory 510 prior to system operation. A multiplier 512 multiplies the division results transmitted from the divider 506 by the appropriate $f(\alpha^e)$ to generate an error correction byte $Y_e$. The "ENABLE" signal generated by the Chien search processor 500 permits transmission of the error correction byte $Y_e$ through an AND gate 514 to the summing node 502 just as the codeword byte corresponding to the location vector $\alpha^e$ arrives at the summing node 502. The result is a corrected codeword byte.

While the invention has been described in detail with reference to preferred embodiments thereof, it is understood that modifications thereof may be made without departing from the spirit and scope of the invention.

What is claimed is:

1. A method for correcting errors in a received codeword, comprising:
    computing in processor means the remainder-based coefficients of said received codeword from a code generator polynomial;
    storing a previous succession of coefficients of an error-descriptive polynomial in individually accessible locations of a memory;
    generating an iterative version of one of said previous succession of error-descriptive polynomial coefficients during a corresponding one of a succession of memory access cycles of said memory from at least a respective one of said remainder-based coefficients and from said previous succession of error-descriptive polynomial coefficients; and
    storing said iterative version of said one error-descriptive polynomial coefficient in one of said individually accessible memory locations so as to replace a respective one of said previous succession of error-descriptive polynomial coefficients therein, whereby said previous succession of error-descriptive polynomial coefficients are replaced in said memory by iterative versions of each of them during repetitive plural memory access cycles.

2. The method of claim 1, further comprising:
    repeating the method of claim 1 over a predetermined number of successive iterations, wherein said previous succession of error-descriptive coefficients are those stored in said memory during the previous one of said iterations; and
    computing from that set of error-descriptive coefficients which is stored in said memory after said predetermined number of successive iterations a set of error values; and
    adding said set of error values to corresponding locations in said received codeword, whereby to correct errors in said codeword.

3. The method of claim 2 further comprising restricting the number of said memory access cycles in each of said iterations, whereby the number of said memory access cycles per iteration increases each iteration up to a maximum number of memory access cycles.

4. The method of claim 3 wherein said maximum number of memory access cycles is no greater than about one half said predetermined number of successive iterations.

5. The method of claim 4 wherein said codeword comprising K message symbols and R redundant check symbols related to said K message symbols through said code generator polynomial, and wherein said predetermined number of successive iterations equals R.

6. A Galois field error correction system including a remainder-based polynomial processor which processes a remainder-based polynomial, said remainder-based polynomial having its own set of coefficients derived from a received data block in accordance with a Galois field code generator polynomial, said remainder-based polynomial processor being adaptable to execute plural iterations of a recursive algorithm so as to generate recursion polynomials in a variable z including an error locator polynomial and an error evaluator polynomial, each of said recursion polynomials being characterized by its own set of coefficients comprising Galois field elements, said remainder-based polynomial processor comprising:
    (1) memory means for storing, in individual accessable locations, the individual ("first") coefficients of said recursion polynomials corresponding to a given one of said iterations of said recursive algorithm, and the individual ("second") coefficients of said remainder-based polynomial;

(2) first memory accessing means for accessing successive ones of said coefficients of each of said recursion polynomials during a corresponding plurality of successive memory access cycles occurring in one of said iterations, whereby said successive coefficients are unloaded from corresponding locations in said memory means during successive memory access cycle, so that said locations are available for receiving a new versions of said successive coefficients;

(3) second memory accessing means for accessing at least a successive one of said accessable locations of said coefficients of said remainder-based polynomial during one of said iterations; and (4) serial arithmetic operator means for performing Galois field arithmetic operations upon the coefficients accessed by said first accessing means, and upon at least the successive one of said second coefficients accessed by said second accessing means during a previous one of said iterations, to generate therefrom a new version of each said first coefficients, and for loading said new version of each of said first coefficients into respective locations accessed by said first accessing means during respective memory access cycles, whereby said serial arithmetic operator means processes the coefficients of said recursion polynomials in serial succession during plural memory access cycles.

7. The error correction system of claim 6 further comprising:
error corrector means operable upon completion of plural iterations of said algorithm, comprising:
search processor means for finding the roots of said locator polynomial;
polynomial evaluator means for evaluating said evaluator polynomial and a derived version of said locator polynomial at each of said roots and generating therefrom an error correction character for each of said roots; and
means for adding said error correction character to said received data block at a location in said received data block corresponding to the respective one of said roots found by said search processor means.

8. The error correction system of claim 6 or 7 further comprising:
means for generating said remainder-based polynomial in a variable z from said received data block in accordance with said Galois field code generator polynomial, said remainder-based polynomial being characterized by its own set of coefficients.

9. The error correction system of claim 6 wherein said remainder-based polynomial comprises one of the following:
(a) a syndrome polynomial, and
(b) a remainder polynomial.

10. The error correction system of claim 6 wherein said first accessing means controls the number of said memory access cycles in which said accessing means accesses successive coefficients during a given one of said iterations of said recursive algorithm, and changes said number of memory access cycles with the number of said iterations executed by said processor so as to reduce the number of memory access cycles required to execute said plural iterations of said algorithm.

11. The error correction system of claim 10 wherein said received data block includes a finite number of check characters and wherein said first accessing means increases said number of memory access cycles by one each time said processor executes one of said algorithm iterations, until said number of memory access cycles is at least nearly equal to one half the number of check characters in said received data block, beyond which said controlling means ceases increasing said number of memory access cycles during subsequent iterations of said algorithm and until completion of said plural iterations of said algorithm.

12. The error correction system of claim 11 wherein said serial Galois field arithmetic operator means further comprise:
(A) means for computing a new set of coefficients for each one of said recursion polynomials during each of said iteration of said algorithm, comprising:
(1) serial Galois field multiplier means operable once each memory access cycle, for multiplying said second constant by the coefficient of each of said locator and evaluator polynomials accessed by said first accessing means to produce first and second product coefficients, respectively;
(2) serial Galois field multiplier means operable once each memory access cycle, for multiplying said first constant by the coefficient of each of said first and second auxiliary polynomials accessed by said first accessing means to produce first and second auxiliary product coefficients, respectively;
(3) Galois field adder means for adding said first product coefficient and said first auxiliary product coefficient together to produce a first product sum, and for adding said second product coefficient and said second auxiliary product coefficient together to produce a second product sum;
(4) multiplexer means operable once each memory cycle for selecting the coefficient accessed by said first accessing means of each one of the following pairs of recursion polynomials:
(a) said locator and evaluator polynomials,
(b) said first and second auxiliary polynomials;
(5) Galois field adder-multiplier means, operable once each memory access cycle, for multiplying said selected pair of coefficients by a polynomial $(z - \alpha^k)$ during the $k^{th}$ one of said iterations, where $\alpha^k$ is a root of said generator polynomial associated with the $k^{th}$ one of said iterations, said Galois field adder-multiplier means comprising:
(a) means for multiplying each one of said selected pair of coefficients by $\alpha^k$ to produce a pair of partial sum coefficients;
(b) multiply-by-z means for holding the pair of partial sum coefficients corresponding to the present memory access cycle while transmitting the pair of partial sum coefficients corresponding to the previous memory access cycle, to produce a corresponding pair of shifted partial sum coefficients;
(c) Galois field adder means for adding said pair of shifted partial sum coefficients with corresponding ones of said pair of selected coefficients to produce a respective pair of result coefficients;
(6)

(a) said multiplexer means being further operable for selecting the accessable memory location of the remaining pair of said recursion polynomials accessed by said first accessing means to receive the corresponding one of said first and second product sums, wherein said selecting is performed in a manner assuring that the recursion polynomials acquire the proper degree upon completion of said algorithm; and (b) said Galois field adder means being further operable for transmitting said pair of result coefficients back to the accessable memory locations of the corresponding ones of said selected pair of coefficients for loading therein.

13. The error correction system of claim 6 wherein said serial Galois arithmetic operator means includes multiplier means for producing a product corresponding to multiplication of one of said recursion polynomials by said independent variable z, said multiplier means comprising delay flip-flop means for shifting the position of each one of the coefficients of said recursion polynomial with respect to its original location in said memory means.

14. The system of claim 6 wherein said arithmetic operator means comprises:

outer loop means operable during a first one of said iterations for performing Galois field arithmetic operations upon at least some of the first coefficients accessed during said first iteration and upon at least one of said second coefficients accessed during said first iteration and producing therefrom a constant character available for use during a later one of said iterations;

inner loop means operable during said later one of said iterations for performing Galois field arithmetic operations upon said constant character and upon a respective one of said first coefficients accessed during a respective memory access cycle of said later one of said iterations, and producing therefrom a new version of one of said first coefficients, and loading it into the location in said memory corresponding to the current memory access cycle, whereby each of said first coefficients is replaced in memory during a respective memory access cycle.

15. The system of claim 14 wherein said outer loop means comprises a Galois field multiplier adaptable for convolving the coefficients of said remainder-based polynomial with the coefficients of said error locator polynomial and producing therefrom said constant character.

16. The system of claim 14 wherein said outer loop means comprise:

polynomial evaluator means for evaluating each of said evaluator and locator polynomials at a location corresponding to the number of said iterations completed to generate a set of polynomial evaluations; and Galois field arithmetic operator means for combining a coefficient of said remainder-based polynomial accessed by said second accessing means with said set of polynomial evaluations and generating therefrom said constant character.

17. A Galois field error correction system including a remainder-based polynomial processor which processes a remainder-based polynomial, said remainder-based polynomial having its own set of coefficients derived from a received data block in accordance with a Galois field code generator polynomial, said remainder-based polynomial processor being adaptable to execute plural iterations of a recursive algorithm so as to generate the following recursion polynomials in a variable z: an error locator polynomial and a first auxiliary polynomial associated therewith, and an error evaluator polynomial and a second auxiliary polynomial associated therewith, each of said recursion polynomials being characterized by its own set of coefficients comprising Galois field elements, said remainder-based polynomial processor comprising:

(1) memory means for storing, in individual accessable locations, the individual ("first") coefficients of said recursion polynomials corresponding to a given one of said iterations of said recursive algorithm, and the individual ("second") coefficients of said remainder-based polynomial;

(2) first memory accessing means for accessing successive ones of said coefficients of each of said recursion polynomials during a corresponding plurality of successive memory access cycles occurring in one of said iterations, whereby said successive coefficients are unloaded from corresponding locations in said memory means during successive memory access cycles so that said locations are available for receiving new versions of said successive coefficients;

(3) second memory accessing means for accessing at least a successive one of said accessable locations of said coefficients of said remainder-based polynomial during one of said iterations; and (4) serial arithmetic operator means for performing Galois field arithmetic operations upon the coefficients accessed by said first accessing means, and upon at least the successive one of said second coefficients accessed by said second accessing means during a previous one of said iterations, to generate therefrom a new version of each of said first coefficients, and for loading said new version of each of said first coefficients into respective locations accessed by said first accessing means during respective memory access cycles, whereby said serial arithmetic operator means processes the coefficients of said recursion polynomials in serial succession during plural memory access cycles.

18. The error correction system of claim 17 wherein said serial Galois field arithmetic operator means comprises:

(A) means for computing a new set of coefficients for each one of said recursion polynomials during each of said iterations of said algorithm, comprising:

(1) serial Galois field polynomial multiplier means, operable once during each of the memory access cycles of a previous one of said iterations, for multiplying the coefficient of said error locator polynomial accessed by said first accessing means by the coefficient of said remainder-based polynomial accessed by said second accessing means, so as to generate a product;

(2) accumulator means operable over all the memory access cycles of said previous one of said iterations, for storing said product obtained during each of said memory access cycles so as to accumulate a Galois field sum of products corresponding to said one iteration;

(3) multiply-by-z means, operable once during each memory access cycle of the current iteration, for delay-shifting the accessable location of the coefficient of each one of said first and second auxiliary polynomials accessed by said first accessing means to generate first and second multiplied coefficients, respectively;

(4) means operable once during each of said memory access cycles of the current iteration, for Galois-field-multiplying said first and second multiplied coefficients by said sum of products to generate first and second product coefficients;

(5) first and second Galois-field-divider means, operable once during each memory access cycle of the current iteration, for dividing the coefficients of said error locator polynomial and of said error evaluator polynomial, respectively, by said sum of products to generate first and second quotients, respectively;

(6) first and second Galois-field-adder means operable once during each memory access cycle of the current iteration for adding the coefficients of said error locator and error evaluator polynomials to said first and second product coefficients, respectively, to generate first and second sums, and for storing said first and second sums in the accessable memory location of each of said error locator and error evaluator polynomials, respectively, accessed by said first accessing means during said memory access cycle;

(7) multiplexer means, operable once during each memory access cycle of the current iteration, for selecting either said first and second multiplied coefficients or said first and second quotients, depending upon whether said sum of products is zero, for storing in the accessable location of each of said first and second auxiliary polynomials, respectively, accessed by said first accessing means during said memory access cycle.

19. The error correction system of claim 17 wherein said serial Galois field arithmetic operator means comprises:

(A) serial Galois field polynomial evaluator means, operable upon execution of each one of said iterations, for evaluating each one of said recursion polynomials by setting said variable z to be equal to a root of said generator polynomial associated with the current iteration, said serial polynomial evaluator means comprising:

(1) Galois field adder means operable once during each memory access cycle, for receiving the coefficient of said one recursion polynomial accessed by said first accessing means during said memory access cycle, and providing a sum therefrom;

(2) register means, operable once each memory access cycle, for receiving and delaying said sum corresponding to the present memory access cycle while transmitting the sum corresponding to the previous memory access cycle;

(3) Galois field multiplier means for receiving said sum transmitted by said register means and multiplying it by said root of said generator polynomial to produce a product, and for transmitting said product to said Galois field adder means for inclusion in said sum during the next memory access cycle;

(4) means for transmitting the contents of said register means whenever said first accessing means completes a maximum number of memory access cycles whereby the contents of said register means so transmitted comprises the evaluation character of said one recursion polynomial.

20. The error correction system of claim 19 wherein said serial Galois field arithmetic operator means further comprises:

(A) means for generating a pair of character constants for each of said iterations of said algorithm, comprising:

(1) Galois field multiplier means operable during each one of said iterations for multiplying the evaluation character of said locator polynomial by a coefficient of said remainder polynomial associated with the current iteration and adding the resulting product to the evaluation character of said first auxiliary polynomial to generate a first constant;

(2) Galois field multiplier means operable during each one of said iterations for multiplying the evaluation character of said evaluation polynomial with said coefficient of said remainder-based polynomial and adding the resulting product to the evaluation character of said second auxiliary polynomial to generate a second constant.

21. An error correction Galois field processor for receiving a transmitted data block comprising a set of message characters corresponding to a message polynomial and a set of redundancy characters which were computed prior to their transmission from said message characters in accordance with a Galois field code generator polynomial, said processor comprising:

(I) means for generating a syndrome polynomial in a variable z from said message and redundancy characters in accordance with said generator polynomial, said syndrome polynomial characterized by its own set of coefficients;

(II) syndrome processor means for processing said syndrome polynomial by executing iterations of a recursive algorithm so as to generate the following recursion polynomials in said variable z: an error locator polynomial and a first auxiliary polynomial associated therewith, and an error evaluator polynomial and a second auxiliary polynomial associated therewith, each of said recursion polynomials being characterized by its own set of coefficients, said syndrome processor means comprising:

(A) means for storing and retrieving individual ones of said coefficients, comprising:

(1) memory means for storing, in individually accessable locations, the individual coefficients of:

(a) said syndrome polynomial, and (b) said recursion polynomials generated by said syndrome processor means during a given one of said iterations of said recursive algorithm;

(2) first accessing means, operable once during each of said iterations, for accessing in successive order all of said accessable memory locations of the coefficients of each of said recursion polynomials during corresponding successive memory access cycles, whereby successive coefficients are unloaded from respective memory locations during respective memory access cycles and thereby made available for receiving new versions of said respective coefficients, said new versions corresponding to the next iteration of said recursive algorithm;

(3) second memory accessing means, operable once during each of said iterations, for accessing in successive order each of said accessable memory locations of said coefficients of said syndrome polynomial;

(B) means for computing a new set of coefficients for each one of said recursion polynomials during each of said iterations of said algorithm, comprising:

(1) serial Galois field polynomial multiplier means, operable once during each of said memory access cycles, for multiplying the coefficient of said error locator polynomial accessed by said first accessing means by the coefficient of said syndrome polynomial accessed by said second accessing means, so as to generate a product;

(2) accumulator means operable over all the memory access cycles of each one of said iterations, for storing said product obtained during each of said memory access cycles so as to accumulate a Galois field sum of products corresponding to said one iteration;

(3) multiply-by-z means, operable once during each memory access cycle, for delay-shifting the accessable location of the coefficient of each one of said first and second auxiliary polynomials accessed by said first accessing means to generate first and second multiplied coefficients, respectively;

(4) means operable once during each of said memory access cycles, for Galois-field-multiplying said first and second multiplied coefficients by the sum of products accumulated by said accumulator means during a previous one of said iterations, to generate first and second product coefficients;

(5) first and second Galois-field-divider means, operable once during each memory access cycle, for dividing the coefficients of said error locator polynomial and of said error evaluator polynomial, respectively, by said sum of products to generate first and second quotients, respectively;

(6) first and second Galois-field-adder means operable once during each memory access cycle for adding the coefficients of said error locator and error evaluator polynomials to said first and second product coefficients, respectively, to generate first and second sums, and for storing said first and second sums in the accessable memory location of each of said error locator and error evaluator polynomials, respectively, accessed by said first accessing means during said memory access cycle;

(7) multiplexer means, operable once during each memory access cycle, for selecting either said first and second multiplied coefficients or said first and second quotients, depending upon whether said sum of products is zero, for storing in the accessable location of each of said first and second auxiliary polynomials, respectively, accessed by said first accessing means during said memory access cycle;

(C) error correcting means comprising:

(1) search processor means for determining the roots of said error locator polynomial, (2) polynomial evaluator means for evaluating said error evaluator polynomial at each of said roots located by said search processor, so as to generate an error correction character corresponding to a respective one of said roots, and (3) means for adding said error correction character to said received message at a location therein corresponding to said respective one root located by said search processor.

22. An error correction Galois field processor for receiving a transmitted data block comprising a set of message characters and a set of redundancy characters which were computed prior to their transmission from said message characters in accordance with a Galois field code generator polynomial, said processor comprising:

(I) means for generating a Galois field remainder polynomial in a variable z from said message and redundancy characters in accordance with said code generator polynomial, said remainder polynomial being characterized by its own set of coefficients;

(II) remainder processor means for processing said remainder polynomial by executing successive iterations of a recursive algorithm so as to generate the following recursion polynomials in a variable z: an error locator polynomial and a first auxiliary polynomial associated therewith, and an error evaluator polynomial and a second auxiliary polynomial associated therewith, each of said recursion polynomials being characterized by its own set of coefficients, said remainder processor comprising:

(A) means for storing and retrieving individual ones of said polynomial coefficients, comprising:

(1) memory means for storing, in individually accessible memory locations, the individual coefficients of:
(a) said remainder polynomial, and
(b) said recursion polynomials generated by said remainder processor means during a given one of said iterations of said recursive algorithm;

(2) first accessing means, operable once during each of said iterations, for accessing in successive order all of said accessable memory locations of the coefficients of each of said recursion polynomials during successive memory access cycles, whereby successive coefficients are unloaded from respective memory locations during respective memory access cycles and thereby made available for receiving new versions of said respective coefficients, said new versions corresponding to the next iteration of said recursive algorithm;

(3) second memory accessing means, operable once during each of said iterations, for accessing a corresponding one of said accessable locations of said coefficients of said remainder polynomial;

(B) serial Galois field polynomial evaluator means, operable upon execution of each one of said iterations, for evaluating each one of said recursion polynomials by setting said variable z to be equal to a root of said generator polynomial associated with the current iteration, said serial polynomial evaluator means comprising:

(1) Galois field adder means operable once during each memory access cycle, for receiving the coefficient of said one recursion polynomial accessed by said first accessing means during said memory access cycle, and providing a sum therefrom;

(2) register means, operable once each memory access cycle, for receiving and delaying said sum corresponding to the present memory access cycle while transmitting the sum corresponding to the previous memory access cycle;

(3) Galois field multiplier means for receiving said sum transmitted by said register means and multiplying it by said root of said generator polynomial to produce a product, and for transmitting said product to said Galois field adder means for inclusion in said sum during the next memory access cycle;

(4) means for transmitting the contents of said register means whenever said first accessing means completes a maximum number of memory access cycles whereby the contents of said register means so transmitted comprises the evaluation character of said one recursion polynomial;

(C) means for generating a pair of character constants for each of said iterations of said algorithm, comprising:

(1) Galois field multiplier means operable during each one of said iterations for multiplying the evaluation character of said locator polynomial by a coefficient of said remainder polynomial associated with the current iteration and adding the resulting product to the evaluation character of said first auxiliary polynomial to generate a first constant;

(2) Galois field multiplier means operable during each one of said iterations for multiplying the evaluation character of said evaluation polynomial with said coefficient of said remainder-based polynomial and adding the resulting product to the evaluation character of said second auxiliary polynomial to generate a second constant;

(D) means for computing a new set of coefficients for each one of said recursion polynomials during each of said iteration of said algorithm, comprising:

(1) serial Galois field multiplier means operable once each memory access cycle, for multiplying said second constant by the coefficient of each of said locator and evaluator polynomials accessed by said first accessing means to produce first and second product coefficients, respectively;

(2) serial Galois field multiplier means operable once each memory access cycle, for multiplying said first constant by the coefficient of each of said first and second auxiliary polynomials accessed by said first accessing means to produce first and second auxiliary product coefficients, respectively;

(3) Galois field adder means for adding said first product coefficient and said first auxiliary product coefficient together to produce a first product sum, and for adding said second product coefficient and said second auxiliary product coefficient together to produce a second product sum;

(4) multiplexer means operable once each memory cycle for selecting the coefficient accessed by said first accessing means of each one of the following pairs of recursion polynomials:
(a) said locator and evaluator polynomials,
(b) said first and second auxiliary polynomials;

(5) Galois field adder-multiplier means, operable once each memory access cycle, for multiplying said selected pair of coefficients by a polynomial $(z-\alpha^k)$ during the $k^{th}$ one of said iterations, where $\alpha^k$ is a root of said generator polynomial associated with the $k^{th}$ one of said iterations, said Galois field adder-multiplier means comprising:

(a) means for multiplying each one of said selected pair of coefficients by $\alpha^k$ to produce a pair of partial sum coefficients;

(b) multiply-by-z means for holding the pair of partial sum coefficients corresponding to the present memory access cycle while transmitting the pair of partial sum coefficients corresponding to the previous memory access cycle, to produce a corresponding pair of shifted partial sum coefficients;

(c) Galois field adder means for adding said pair of shifted partial sum coefficients with corresponding ones of said pair of selected coefficients to produce a respective pair of result coefficients;

(6)
(a) said multiplexer means being further operable for selecting the accessable memory location of the remaining pair of said recursion polynomials accessed by said first accessing means, to receive the corresponding one of said first and second product sums, wherein said selecting is performed in a manner assuring that the recursion polynomials acquire the proper degree upon completion of said algorithm;

(b) and said Galois field adder means being further operable for transmitting said pair of result coefficients back to the accessable memory locations of the corresponding ones of said selected pair of coefficients for loading therein;

(III) error correcting means comprising:
(A) search processor means for determining the roots of said locator polynomial,
(B) polynomial evaluator means for evaluating said evaluator polynomial at each of said roots located by said search processor, so as to generate an error correction character corresponding to each respective one of said roots, and
(C) means for adding said error correction character to said received message at a location therein corresponding to said respective one root located by said search processor.

23. The system of claim 6, 17, 21 or 22 wherein the memory locations into which each of said new versions of said first coefficients are loaded are shifted by at least one memory location with respect to the memory location of its predecessor.

* * * * *